United States Patent
Okita et al.

(10) Patent No.: US 8,044,447 B2
(45) Date of Patent: Oct. 25, 2011

(54) SEMICONDUCTOR DEVICE AND METHOD FOR MANUFACTURING THE SAME

(75) Inventors: Yoichi Okita, Kawasaki (JP); Genichi Komuro, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 378 days.

(21) Appl. No.: 12/031,193

(22) Filed: Feb. 14, 2008

(65) Prior Publication Data
US 2008/0142865 A1 Jun. 19, 2008

Related U.S. Application Data

(63) Continuation of application No. PCT/JP2005/014930, filed on Aug. 15, 2005.

(51) Int. Cl.
*H01L 21/02* (2006.01)
*H01L 21/20* (2006.01)
(52) U.S. Cl. .......... 257/295; 257/E21.664; 438/396
(58) Field of Classification Search .......... 257/295; 438/396
See application file for complete search history.

(56) References Cited

U.S. PATENT DOCUMENTS

| | | | |
|---|---|---|---|
| 6,144,052 A | 11/2000 | Kushida et al. | |
| 6,744,092 B2 | 6/2004 | Kweon | |
| 7,176,132 B2 | 2/2007 | Sashida et al. | |
| 7,268,472 B2 | 9/2007 | Higuchi et al. | |
| 2003/0047771 A1 | 3/2003 | Kweon et al. | |
| 2003/0054634 A1* | 3/2003 | Lee et al. | 438/675 |
| 2003/0162401 A1 | 8/2003 | Kikuchi et al. | |

FOREIGN PATENT DOCUMENTS

| | | |
|---|---|---|
| JP | 2001-345432 A | 12/2001 |
| JP | 2003-31775 A | 1/2003 |
| JP | 2003-133534 A | 5/2003 |
| JP | 2003-258203 A | 9/2003 |
| JP | 2004-153031 A | 5/2004 |
| JP | 2004-193430 A | 7/2004 |
| JP | 2004-207692 A | 7/2004 |
| WO | 97/33316 A1 | 9/1997 |

OTHER PUBLICATIONS

Chinese Office Action dated Aug. 4, 2010, issued in corresponding Chinese Patent Application No. 2005-80051319.6.
International Search Report of PCT/JP2005/014930, date of mailing Oct. 25, 2005.

* cited by examiner

*Primary Examiner* — William D Coleman
(74) *Attorney, Agent, or Firm* — Westerman, Hattori, Daniels & Adrian, LLP

(57) ABSTRACT

There is provided a semiconductor device including a silicon substrate, a source/drain region formed in a surface layer of the silicon substrate, a first insulating film provided with a first hole on the first source/drain region, a conductive film formed on an inner surface of the first hole, a filler body, which is formed with a thickness to fill the first hole on the first conductive film, forms a first conduct plug together with the conductive film, and is formed of an insulating material with an upper surface being amorphous, and a capacitor, which is formed on the first contact plug and is provided with a lower electrode electrically connected to the conductive film, a capacitor dielectric film formed of a ferroelectric material, and an upper electrode.

20 Claims, 22 Drawing Sheets

SEMICONDUCTOR DEVICE AND METHOD FOR MANUFACTURING THE SAME

CROSS-REFERENCE TO RELATED APPLICATIONS

This application is a continuation of prior International Patent Application No. PCT/JP2005/014930, filed Aug. 15, 2005, the entire contents of which are incorporated herein by reference.

TECHNICAL FIELD

It is related to a semiconductor device and a method for manufacturing the same.

BACKGROUND

Flash memories and ferroelectric memories are known as non-volatile memories capable of retaining stored information even after power is turned off.

Among these, the flash memories have a floating gate embedded in a gate insulating film of an insulated-gate field-effect transistor (IGFET) to store information by accumulating electric charges indicating information to be stored in this floating gate. However, it is required for such a flash memory that a tunnel current is applied to the gate insulating film at the time of writing or erasing information. Thus, there is a disadvantage that a relatively high voltage is needed.

In contrast, the ferroelectric memories, which are also referred to as ferroelectric random access memories (FeRAMs), store information by utilizing hysteresis characteristics of a ferroelectric film with which a ferroelectric capacitor is provided. The ferroelectric film is polarized depending on a voltage applied between upper and lower electrodes of the capacitor, and spontaneous polarization remains even after the voltage is turned off. When polarity of an applying voltage is reversed, the spontaneous polarization is also reversed. Directions of spontaneous polarization are associated with "1" and "0", so that information is written in the ferroelectric film. FeRAMs have advantages that a voltage required for this writing is lower than that required for the flash memories, and writing can be carried out at a higher speed than that of the flash memories.

The FeRAMs are broadly classified into stack-type FeRAMs and planar-type FeRAMs according to their structure. In the latter planar-type FeRAMs, a MOS transistor formed in a semiconductor substrate and a capacitor lower electrode are electrically connected through a metal wiring over a capacitor. Thus, it has a tendency that a planar shape of the capacitor tends to become larger.

In contrast, in the stack-type FeRAMs, a capacitor lower electrode is formed directly on a contact plug connected to a source/drain region of a MOS transistor, and the lower electrode and the MOS transistor are electrically connected through the contact plug. With such a structure, the planar shape of the capacitor can be made smaller than that of the planar-type FeRAMs. Thus, the stack-type FeRAMs have an advantage in miniaturization of FeRAMs which is expected to be required in the future.

As the contact plug of the stack-type FeRAMs, a tungsten plug is generally used. However, in patent literatures 1 to 4, there is disclosed a configuration that the contact plug is formed of a material other than tungsten.

For example, patent literature 1 discloses that the contact plug is formed of polycrystalline or amorphous silicon, and patent literature 2 discloses that the contact plug is formed of tungsten nitride. In addition, patent literature 3 discloses that the contact plug is formed of iridium, and patent literature 4 discloses that the contact plug is formed of iridium or ruthenium.

Note that a technology relating to the present embodiments is also disclosed in patent literature 5.

Patent literature 1: International Publication No. 97/33316, Pamphlet
Patent literature 2: Japanese Patent Application Laid-open Publication No. 2001-345432
Patent literature 3: Japanese Patent Application Laid-open Publication No. 2003-133534
Patent literature 4: Japanese Patent Application Laid-open Publication No. 2003-31775
Patent literature 5: Japanese Patent Application Laid-open Publication No. 2004-153031

Incidentally, when a general tungsten plug is employed as the above-described contact plug, a crystal orientation of tungsten affects an orientation of a lower electrode on the plug. Thereby, an orientation of a capacitor dielectric film is not oriented in a desired direction in some cases. If this is the case, ferroelectric characteristics of the capacitor dielectric film, such as residual polarization charges, are reduced. This is not preferable, since it is made difficult to perform the writing and reading operation in the capacitor.

In addition, when a tungsten plug is used as a contact plug as described above, there is a case where a conductive oxygen barrier film is formed between the contact plug and the lower electrode in order to prevent oxidation of tungsten. In this case, an orientation of the conductive oxygen barrier film is also affected by a crystal orientation of tungsten. Thus, there is a problem that the ferroelectric characteristics of the capacitor dielectric film are deteriorated, as in the case of the foregoing description.

Such a problem can be caused not only in the tungsten plug, but also in the contact plug in which crystalline material is used. Accordingly, the ferroelectric characteristics of the capacitor dielectric film are deteriorated even when the crystalline materials such as tungsten nitride, iridium, and ruthenium are used for the contact plugs as in the Patent literatures 2 to 4.

In addition, after the capacitor dielectric film is formed by patterning, annealing, which is referred to as recovery annealing, is carried out for the capacitor dielectric film in an oxygen atmosphere to compensate oxygen deficiency caused in the capacitor dielectric film at the time of the patterning. In the technology of patent literature 1 in which amorphous silicon is employed as the contact plug, contact resistance of the contact plug can be increased, because a surface of the contact plug is oxidized by the recovery annealing.

SUMMARY

It is one aspect of the embodiments discussed herein to provide a semiconductor device including a semiconductor substrate, a first impurity diffusion region formed in a surface layer of the semiconductor substrate, a first insulating film provided with a first hole over the first impurity diffusion region, a conductive film, which is formed over an inner surface of the first hole and is electrically connected to the first impurity diffusion region, a filler body, which is formed on the conductive film with a thickness to fill the first hole, where the filler body constituting a first contact plug together with the conductive film, and at least an upper surface of the filler body being made of amorphous insulating material, and a capacitor, which is formed over the first contact plug and is provided with a lower electrode electrically connected to the conductive film, a capacitor dielectric film formed of a ferroelectric material, and an upper electrode These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Figure 1A:
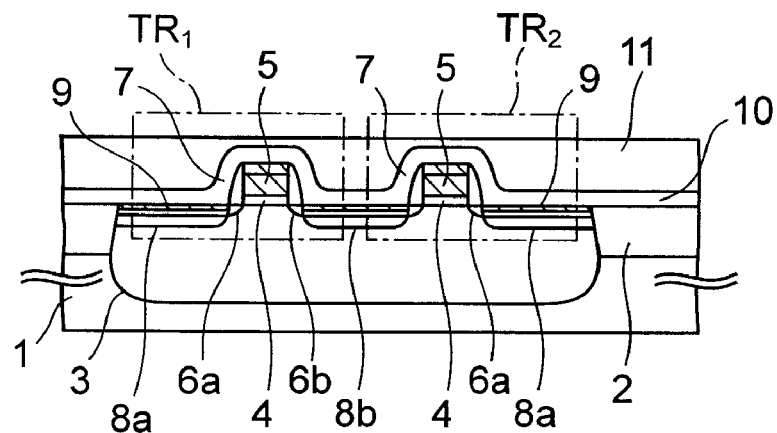
FIGS. 1A to 1M are cross-sectional views showing processes of manufacturing a hypothetical semiconductor device.

Embodiments will be descried in detail below by referring to the accompanying drawings.

(Preliminary Explanation)

Prior to describing the embodiments, preliminary explanation of the present embodiments will be given below.

FIGS. 1A to 1M are cross-sectional views showing processes of a hypothetical semiconductor device. This semiconductor device is a stack-type FeRAM, and is manufactured in the following manner.

Firstly, processes for obtaining a cross-sectional structure shown in FIG. 1A will be described.

A groove for shallow trench isolation (STI) for defining an active region of a transistor is formed in a surface of an n-type or p-type silicon (semiconductor) substrate 1. An insulating film, such as silicon oxide, is then filled therein to use it as a device isolation insulating film 2. Note that a device isolation structure is not limited to STI, and the device isolation film 2 may be formed by a local oxidation of silicon (LOCOS) method.

Subsequently, after forming a p-well 3 by introducing p-type impurities into the active region of the silicon substrate 1, a surface of the active region is thermally oxidized to form a thermally-oxidized film to be a gate insulating film 4.

After that, an amorphous or polycrystal silicon film is formed on an entire upper surface of the silicon substrate 1, and this film is then patterned into two gate electrodes 5 by photolithography.

The two gate electrodes 5 are arranged in substantially parallel at a distance from each other, and constitute a part of a ward line.

Then, n-type impurities are introduced into the silicon substrate 1 beside the gate electrodes 5 by ion implantation using the gate electrodes 5 as a mask. Thereby, first and second source/drain extensions 6a and 6b are formed.

Thereafter, an insulating film is formed on the entire upper surface of the silicon substrate 1, and the insulating film is etched back to be left beside the gate electrodes 5 as insulating sidewalls 7. As the insulating film, a silicon oxide film is formed by the CVD method, for example.

Subsequently, while using the insulating sidewalls 7 and the gate electrodes 5 as a mask, n-type impurities are ion-implanted into the silicon substrate 1 again, so that first and second source/drain regions (first and second impurity diffusion regions) 8a and 8b are formed in the silicon substrate 1 beside the two gate electrodes 5 at a distance from each other.

By the processes so far, first and second MOS transistors $TR_1$ and $TR_2$, each of which is constructed from the gate insulating film 4, the gate electrode 5, and first and second source/drain regions 8a and 8b, are formed in the active region of the silicon substrate 1.

Next, after forming a refractory metal layer such as a cobalt layer is formed on the entire upper surface of the silicon substrate 1 by the sputtering method, this refractory metal layer is caused to react with silicon by annealing. Thereby, a refractory metal silicide layer 9 is formed on the silicon substrate 1. The refractory metal silicide layer 9 is also formed on surface portions of the gate electrodes 5, so that the resistance of gate electrodes 5 is lowered.

After that, the refractory metal layer, which is left unreacted on the device isolation insulating film 2, and the like, is removed by wet etching.

Subsequently, a silicon nitride (SiN) film is formed as a cover insulating film 10 with a thickness of approximately 80 nm on the entire upper surface of the silicon substrate 1. After that, a silicon oxide film as a first insulating film 11 is formed with a thickness of approximately 11000 nm on the cover insulating film 10 by the plasma CVD method using a TEOS gas.

Thereafter, the upper surface of the first insulating film 11 is polished and planarized by the chemical mechanical polishing (CMP) method. As a result of this CMP, the thickness of the first insulating film 11 becomes approximately 800 nm on a flat surface of the silicon substrate 1.

Figure 1B:
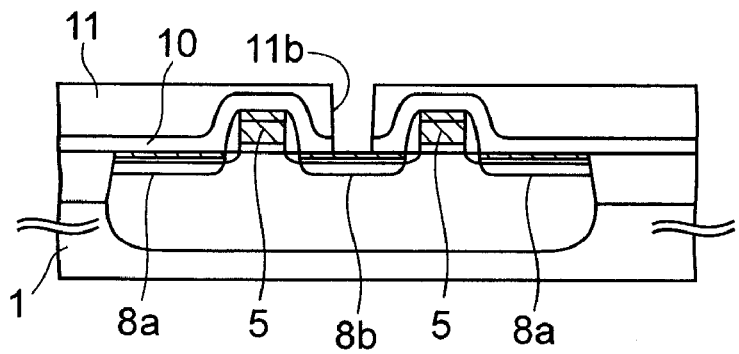

Next, as shown in FIG. 1B, the cover insulating film 10 and the first insulating film 11 are patterned by photolithography to form a second hole 11b over the second source/drain region 8b between the two gate electrodes 5.

Figure 1C:
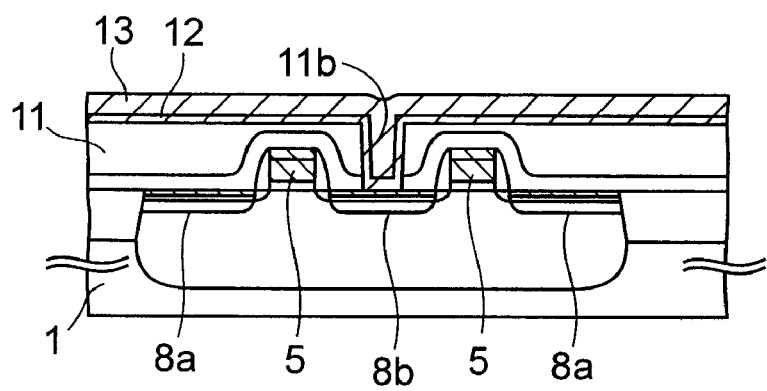

Next, as shown in FIG. 1C, a titanium film and a titanium nitride film are formed in this order on the upper surface of the first insulating film 11 and the inner surface of the second hole 11b by the sputtering method. A laminated film of these films is used as a first glue film 12. The titanium film constituting the first glue film 12 plays a role of making ohmic contact with the silicon substrate 1.

Subsequently, a first tungsten film 13 is formed on the first glue film 12 by the CVD method using a tungsten hexafluoride gas, thereby completely filling the second hole 11b with the first tungsten film 13.

Incidentally, this tungsten film 13 has a stress stronger than other films. Accordingly, if a film thickness of the tungsten film 13 is set to be large, film exfoliation is possibly caused due to warp of the silicon substrate 1. To deal with this problem, the diameter of the second hole 11b is set as small as possible, for example to 0.25 µm, thereby thinning the minimum thickness required for filling the second hole 11b in the present example. According to this, required thickness of the tungsten film 13 is lowered to about 300 nm, so that the film exfoliation due to the stress of the tungsten film 13 can be prevented.

Figure 1D:
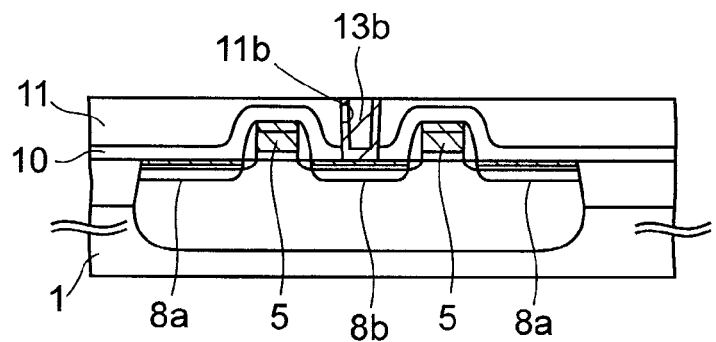
Figure 1E:
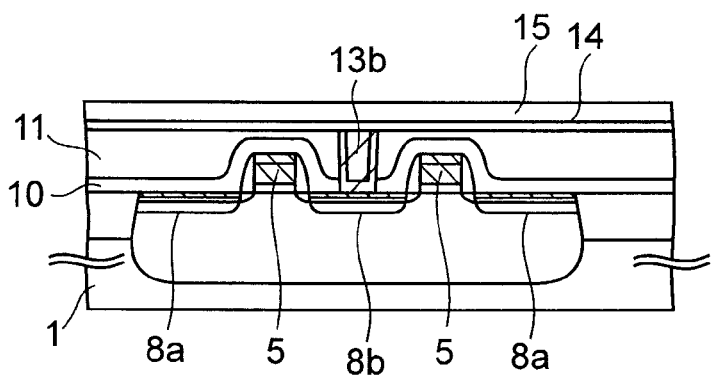

Next, as shown in FIG. 1D, the excessive first glue film 12 and first tungsten film 13 formed on the first insulating film 11 are polished and removed by the CMP method, so as to leave these films 12 and 13 in the second hole 11b as a second contact plug 13b. This second contact plug 13b is electrically connected to the second source/drain region 8b, and constitutes a part of a bit line together with the second source/drain region 8b.

Here, the second contact plug 13b is mainly formed of the first tungsten film 13 as described above. However, tungsten is oxidized very easily, and causes contact defect when oxidized during the processes.

Figure 2A:
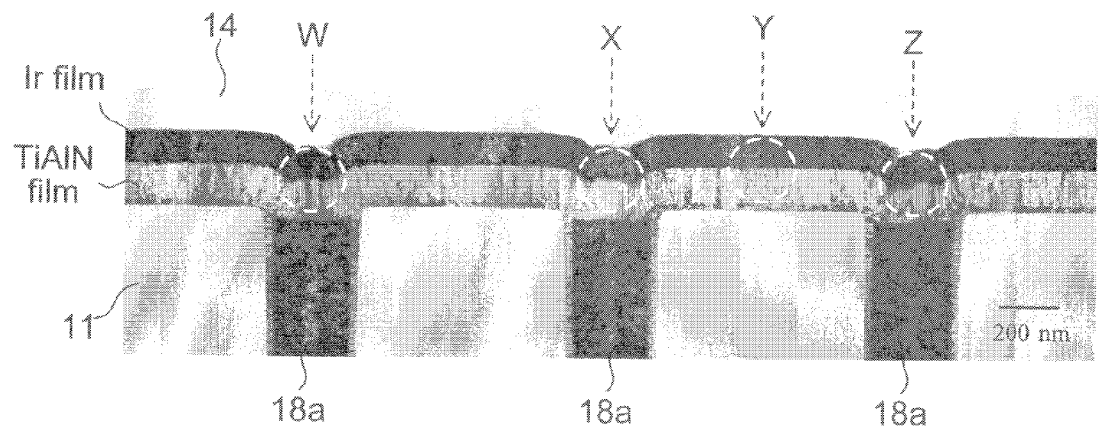
FIG. 2A is an image obtained when a cross-section of a sample is observed by using TEM in order to check a state of recesses caused in contact plugs.
Figure 2B:
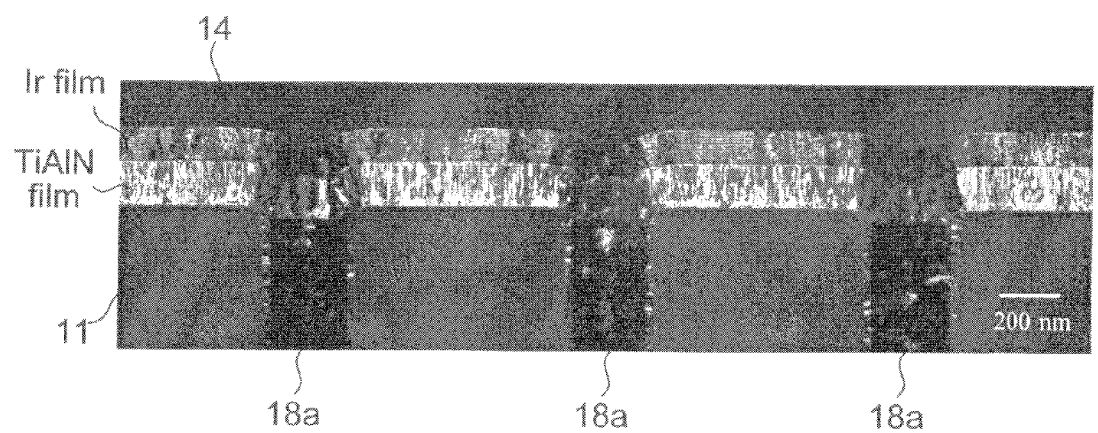
FIG. 2B is a dark field image of FIG. 2A.

To deal with this problem, in the next process, as shown in FIG. 2(b), a silicon oxynitride (SiON) film is formed with a thickness of approximately 130 nm by the plasma CVD method as an oxidation preventive insulating film 14 for protecting the second contact plug 13b from an oxidizing atmosphere.

Thereafter, a silicon oxide film is formed as an insulating adhesive film 15 with a thickness of approximately 200 nm on the oxidation preventive insulating film 14 by the plasma CVD method.

Figure 1F:
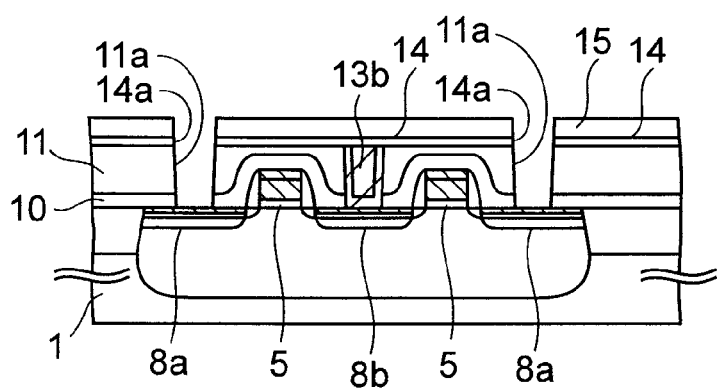

Subsequently, as shown in FIG. 1F, the films from the insulating adhesive film 15 through the cover insulating film 10 are etched by using an unillustrated resist pattern as a mask. Thereby, first openings 14a are formed in the oxidation preventive insulating film 14, and first holes 11a are formed under the first openings 14a. The etching is carried out by reactive ion etching (RIE), which uses a mixed gas of $C_4F_8$, Ar, and $O_2$ as an etching gas for example.

Figure 1G:
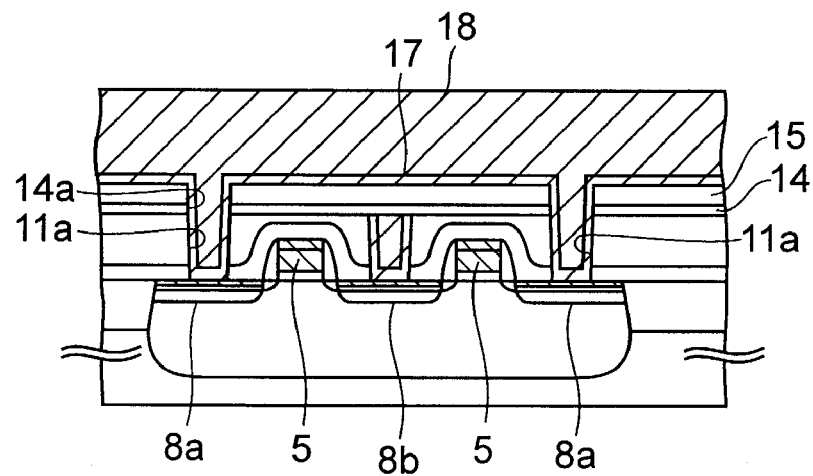

Next, as shown in FIG. 1G, a second glue film 17 is formed in each of the first openings 14a and the first holes 11a and on the upper surface of the insulating adhesive film 15 by the sputtering method. Thereafter a second tungsten film 18 is formed on the second glue film 17 by the CVD method, so that the first holes 11a are completely filled with the second tungsten film 18. Note that similar to the first glue film 12, the second glue film 17 is formed by laminating a titanium film and a titanium nitride film in this order, and ohmic contact with the silicon substrate 1 is made through the titanium film.

In addition, similar to the first tungsten film 13 described in FIG. 1C, this second tungsten film 18 also has a strong stress. Therefore, the diameters of the first holes 11a are set to be small so that the first holes 11a would be filled even by the second tungsten film 18 with a thin film thickness. In the present example, the diameters of the first holes 11a are set to be as small as 0.25 μm, so that the thickness of the second tungsten film 18 can be thinned to approximately 300 μm. Thereby, the film exfoliation due to the stress of the second tungsten 18 can be prevented. Note that the minimum film thickness of the second tungsten film 18, which is required for filling the first holes 11a completely, is typically equal to or thicker than a half of a diameter of the first hole 11a.

Figure 1H:
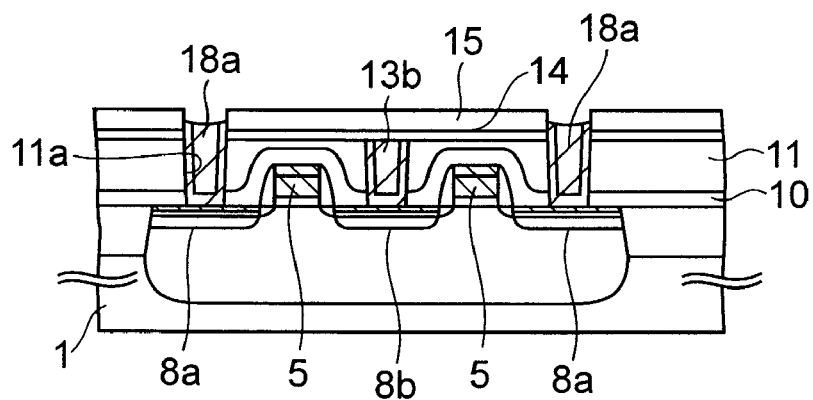

Next, as shown in FIG. 1H, the excessive second glue film 17 and second tungsten film 18 formed on the upper surface of the insulating adhesive film 15 are polished and removed by the CMP method, so as to leave these films 15 and 17 in the first holes 11a as first contact plugs 18a.

In this CMP, the insulating adhesive film 15 is used as a polishing stopper, and thus the polishing is carried out under a condition where a polishing rate of the second tungsten film 18 becomes higher than that of the insulating adhesive film 15. For this reason, at the time of finishing the CMP, recesses (concave portions) are formed on the upper surfaces of the first contact plugs 18a due to the difference between polishing rate of the insulating adhesive film 15 and the second tungsten film 18, as shown in the figure.

Figure 1I:
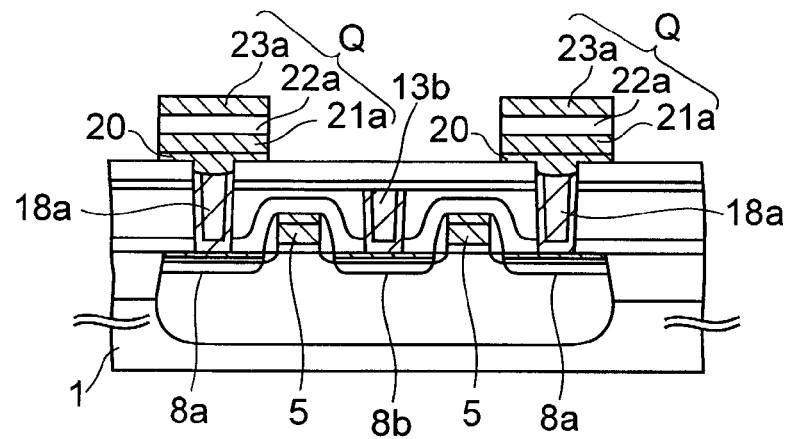

After that, as shown in FIG. 1I, a conductive oxygen barrier film 20 made of titanium aluminum nitride (TiAlN), or the like, is formed on the first contact plugs 18a. Furthermore, capacitors Q, which are constructed by laminating a lower electrode 21a, a capacitor dielectric film 22a, and an upper electrode 23a in this order, are formed on the conductive oxygen barrier film 20.

Note that the lower electrodes 21a are made of an iridium film which is formed with a thickness of approximately 50 to 200 nm by the sputtering method, and the capacitor dielectric films 22a are made of a lead zirconate titanate (PZT: PbZr-TiO$_3$) film which is formed with a thickness of approximately 50 to 150 nm by the metal organic CVD (MOCVD) method. In addition, the upper electrodes 23a are made of an iridium oxide (IrO$_2$) film which is formed with a thickness of approximately 50 to 200 nm by the sputtering method.

After that, in order to recover damages received in the capacitor dielectric films 22a during the etching and sputtering at the time of forming the capacitors Q, the capacitors Q are annealed in the oxygen atmosphere. Such annealing is also referred to as recovery annealing.

The first contact plugs 18a directly under the capacitors Q are protected by the conductive oxygen barrier film 20 formed thereon from being oxidized during the recovery annealing. In addition, the second contact plug 13b, which constitutes a part of the bit line, is protected by the oxidation preventive insulating film 14 from being oxidized.

Figure 1J:
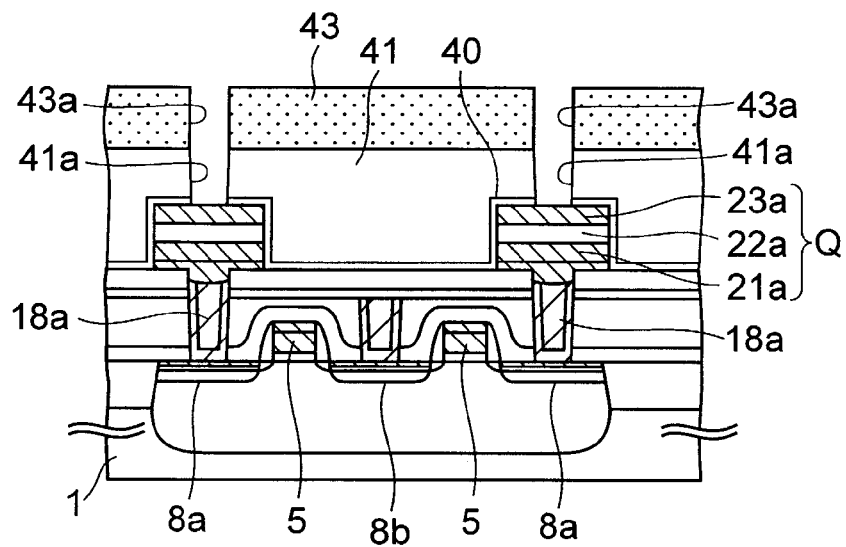

Next, processes for obtaining a cross-sectional structure shown in FIG. 1J will be described.

Firstly, in order to protect the capacitor dielectric films 22a from a reducing atmosphere such as hydrogen, an alumina film with an excellent hydrogen blocking capability is formed with a thickness of approximately 50 nm on the entire upper surface of the silicon substrate 1 as a capacitor protective insulating film 40 by the sputtering method.

After that, a silicon oxide film as a second insulating film 41 is formed on the capacitor protective insulating film 40 by the plasma CVD method, and thereafter the upper surface of the second insulating film 41 is planarized by the CMP method, so that the thickness of the second insulating film 41 on the flat surface of the silicon substrate 1 becomes approximately 700 nm.

Then, a first resist pattern 43 provided with first windows 43a is formed on the second insulating film 41. Thereafter, the second insulating film 41 and the capacitor protective insulating film 40 are etched through the first windows 43a to form third holes 41a on the upper electrodes 23a.

The first resist pattern 43 is removed after the etching is finished.

After that, in order to recover damages received in the capacitor dielectric films 22a during the processes so far, the silicon substrate 1 is placed in an unillustrated furnace, and then the second recovery annealing is carried out in an oxygen atmosphere at a substrate temperature of 550° C. for approximately 40 minutes.

Figure 1K:
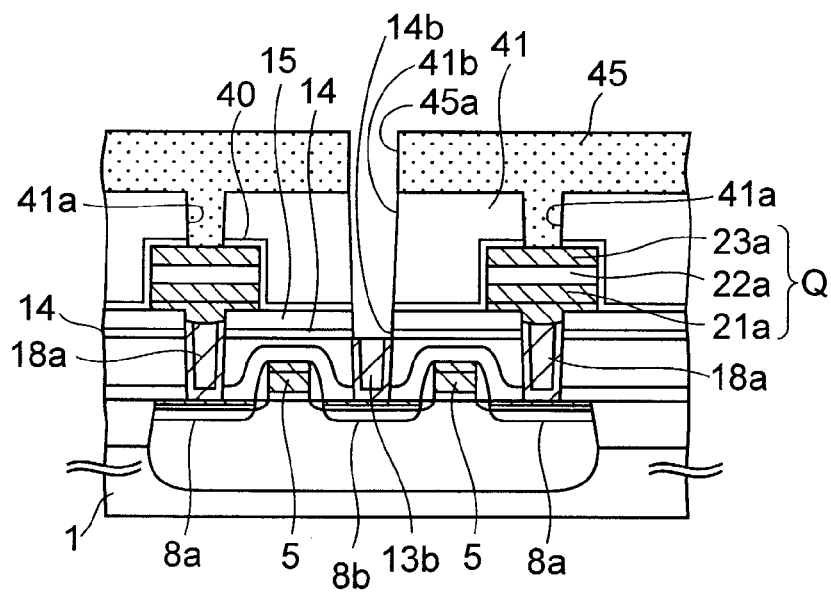

Next, processes for obtaining a cross-sectional structure shown in FIG. 1K will be described.

Firstly, a photoresist is coated on the entire upper surface of the silicon substrate 1. Then, the photoresist is exposed and developed, so that a second resist pattern 45 provided with a second window 45a over the second contact plug 13b is formed.

After that, the films from the second insulating film 41 through the oxidation preventive insulating film 14 are etched through the second window 45a of the second resist pattern 45. Thus, a fourth contact hole 41b is formed in the second insulating film 41 over the second contact plug 13b, and a second opening 14b is formed in the oxidation preventive insulating film 14 under the fourth contact hole 41b.

Figure 1L:
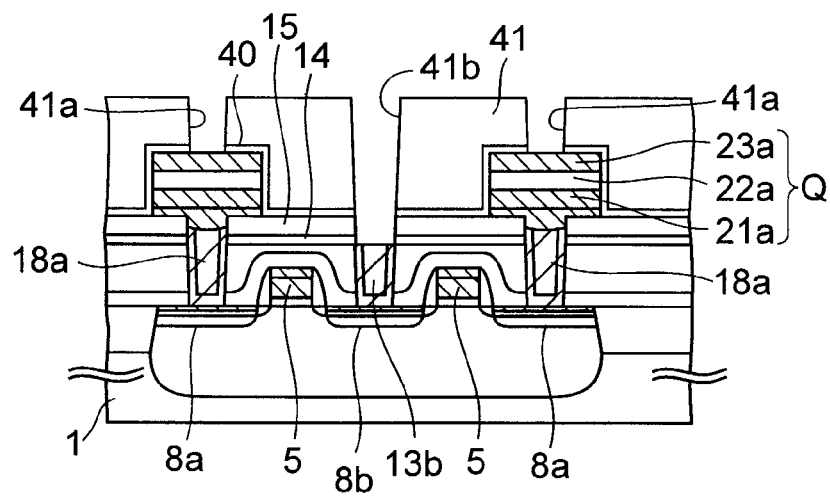

Next, as shown in FIG. 1L, the second resist pattern 45 is removed.

Figure 1M:
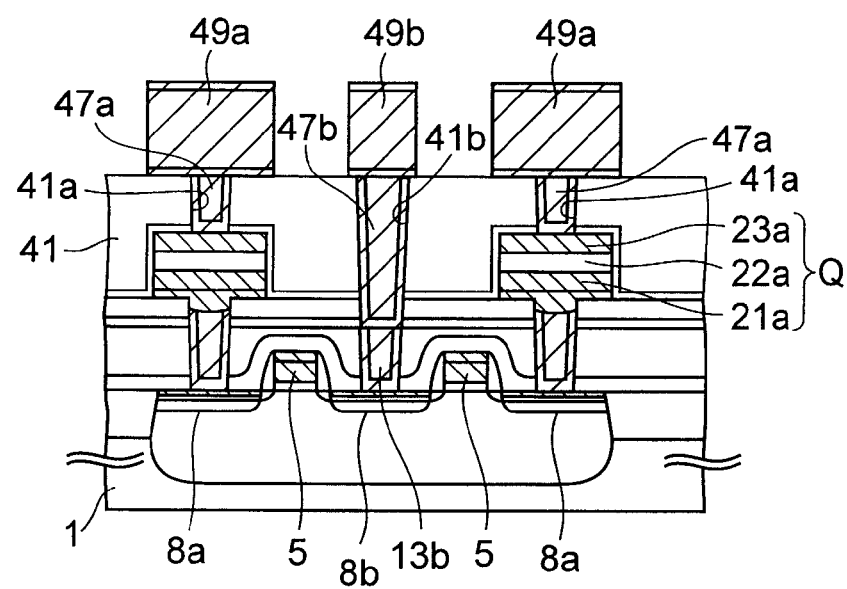

Next, as shown in FIG. 1M, third and fourth contact plugs 47a and 47b, which are mainly formed of tungsten, are respectively formed in the third and fourth contact holes 41a and 41b.

After that, a metal laminated film, which is mainly formed of an aluminum film, is formed on an upper surface of each of the second insulating film 41 and the third and fourth contact holes 41a and 41b by the sputtering method. Thereafter, the metal laminated film is patterned by photolithography to form first layer metal wirings 49a and a bit line metal pad 49b.

With this, the basic structure of a stack-type FeRAM has been completed.

In the above-described example, as described in FIG. 1H, the recesses are formed by polishing the upper surfaces of the first contact plugs 18a by the CMP method.

FIG. 2A is an image obtained by observing a cross-section of a sample by use of TEM in order to investigate the recesses. The sample is formed in such a manner that: first contact plugs 18a are filled in the above-described first insulating film 11; thereafter, a titanium aluminum nitride (TiAlN) film to be a conductive oxygen barrier film 20 (see, FIG. 1I) and an iridium (Ir) film to be a lower electrode 21a are formed in this order; and an oxidation protective insulating film 14 is further formed thereon.

As shown in FIG. 2A, it can be seen that recesses due to CMP are actually formed in the first contact plugs 18a. In addition, as shown in the figure, recessed portions are also caused in the titanium aluminum nitride film and the iridium film on the first contact plugs 18a.

FIG. 2B is a dark field image of the TEM image of the FIG. 2A. As shown in the figure, the titanium aluminum nitride film in portions where the recessed portions are formed becomes darker than other portions. Accordingly, it is understood that the crystal structure of the recessed portions of the titanium aluminum nitride film is different from that of other portions. In addition, a tendency similar to this can also be seen in the iridium film.

Figure 2C:
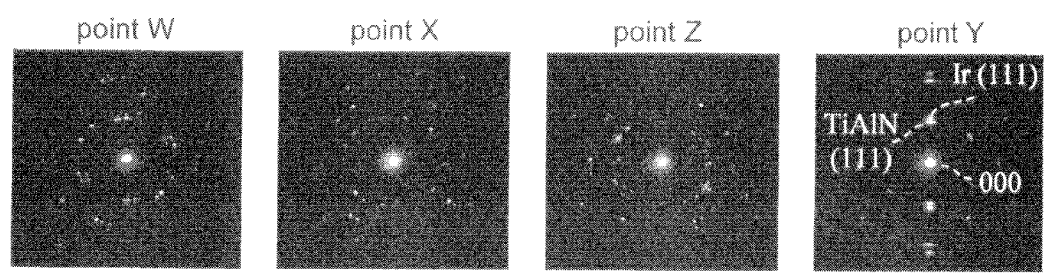
FIG. 2C shows electron diffraction images in points W to Z in FIG. 2A.

FIG. 2C shows electron diffraction images at the points W to Z in FIG. 2A.

As shown in FIG. 2C, at the point Y present on the flat surface of the first insulating film 11, a diffraction line corresponding to a (111) direction of each of the titanium aluminum film and the iridium film is strongly generated. This indicates that orientations of the titanium aluminum film and the iridium film are preferable in the point Y.

In contrast, in the points W to Z on the first contact plugs 18a, such a strong diffraction line is not appeared, which indicates that the orientations of the titanium aluminum film and the iridium film are deteriorated due to the recesses of the plugs 18a.

If the orientation of the iridium film is deteriorated in this manner, the orientation of the capacitor dielectric film 22a (see FIG. 1M) formed thereon is disordered, so that ferroelectric characteristics of the capacitor dielectric film 22a, such as residual polarization charges, are deteriorated. Accordingly, it is not preferable.

In addition to such a problem of recesses, as shown in FIG. 1H, in order to prevent the oxidation of the second contact plug 13b constituting the bit line, formation of the second contact plug 13b is needed to be performed in a process different from that of the first contact plugs 18a directly under the capacitors, and the upper surface of the second contact plug 13b needs to be covered by the oxidation preventive insulating film 14.

However, when the first and second contact plugs 18a and 13b are formed separately, and when the oxidation preventive insulating film 14 is formed on the second conductive plug 13b in this manner, the number of the steps in the manufacturing process of a semiconductor device increases, so that the cost of manufacturing the semiconductor device increases.

With a view to the foregoing problems, the inventor of the present application has come up with the embodiments described below.

First Embodiment

FIGS. 3A to 3L are cross-sectional views showing processes of manufacturing a semiconductor device according to a first embodiment.

In order to manufacture this semiconductor device, the above-described processes of FIGS. 1A to 1F are firstly carried out.

Figure 3A:
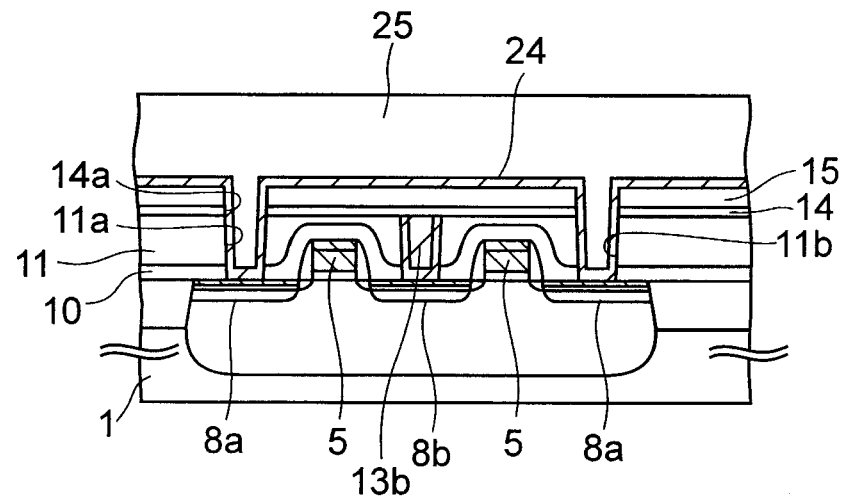
FIGS. 3A to 3L are cross-sectional views showing processes of manufacturing a semiconductor device according to a first embodiment.

After that, as shown in FIG. 3A, a conductive film 24 is formed on an insulating adhesive film 15, in a first opening 14a, and in a first hole 11a.

The conductive film 24 is formed of a material, which hardly loses conductivity even after high temperature annealing, such as recovery annealing to be carried out later, is carried out in an oxygen atmosphere. Such conductive film 24 includes, for example, either a single layer film of any one of a titanium film, a titanium nitride film, a titanium aluminum nitride film, an iridium film, an iridium oxide ($IrO_2$) film, a platinum film, and a ruthenium film, or a laminated film formed by laminating at least two of these films. Although these films can be formed by the sputtering method, the titanium nitride film may be formed by the CVD method.

Furthermore, a thickness of the conductive film 24 is set to such a value that the contact resistance with the first source/drain regions 8a thereunder becomes a designed value. In the present embodiment, the thickness of the conductive film 24 is set to 20 to 100 nm, for example.

In the present embodiment, the insulating adhesive film 15 is formed for the purpose of increasing adhesiveness with a lower electrode of a capacitor. However, in the case where the adhesiveness of the lower electrode is not lost without the insulating adhesive film 15, the film 15 may be omitted. In this case, the above-described conductive film 24 is to be formed on an oxidation preventive insulating film 14.

After that, a silicon oxide film is formed on the conductive film 24 as an amorphous insulating material film 25 by the plasma CVD method. Thus, the first opening 14a and the first hole 11a are filled with the insulating material film 25. This plasma CVD method uses, for example, a silane ($SiH_4$) gas as a reaction gas.

The insulating material film 25 is not limited to the silicon oxide film as long as it is a film formed of an amorphous insulating material. In place of the silicon oxide film, the insulating material film 25 may be formed of any one of a silicon nitride film, a silicon oxynitride film, and an alumina film.

Furthermore, a thickness of the insulating material film 25 is not particularly limited as long as the insulating material film 25 can completely fill the first contact hole 11a. In the present embodiment, the thickness of the insulating material film 25 is set to approximately 300 nm over a flat surface of the silicon substrate 1.

Figure 3B:
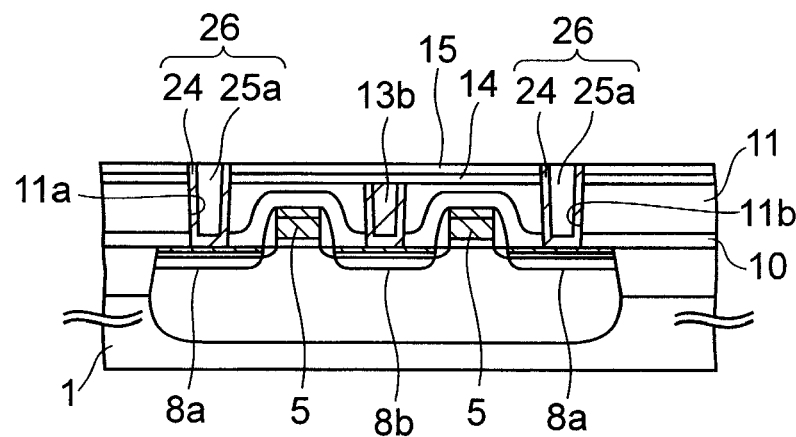

Next, as shown in FIG. 3B, the conductive film 24 and insulating material film 25 on the insulating adhesive film 15 are polished and removed by the CMP method. Thus, the insulating material film 25 left in the first opening 14a and the first hole 11a is used as filler bodies 25a. Slurry (an abrasive) used in this CMP method is not particularly limited as long as it is to be used for an insulating film. In the present embodiment, for example, slurry manufactured by Cabot Microelectronics Corporation, is used as the slurry.

In this CMP, the insulating adhesive film 15 is also polished, and the film thickness thereof is decreased. However, by using the above-described slurry for an insulating film, a polishing rate of the insulating adhesive film 15 becomes substantially same as that of the insulating material film 25. Accordingly, the upper surfaces of the insulating material film 25 and the insulating adhesive film 15 are lowered at a substantially same rate during CMP. Thus, recesses are not formed in the upper surfaces of the filler bodies 25a after the CMP is finished.

In the case where the insulating adhesive film 15 is omitted, the oxidation protective insulating film 14 is also polished by the above-described CMP. However, the polishing rate of the oxidation protective insulating film 14 is also substantially same as that of the insulating material film 25. Therefore, recesses are not formed in the upper surfaces of the filler bodies 25a as described above.

By this step, first contact plugs 26 in which side and bottom surfaces of the filler body 25a are covered with the conductive film 24 are formed in the first holes 11a so as to be electrically connected to the first source/drain regions 8a. As shown in the figure, heights of the upper surfaces of the first contact plugs 26 become higher by the thicknesses of the oxidation preventive insulating film 14 and the insulating adhesive film 15 than a height of the upper surface of the second contact plug 13b.

After that, each of the upper surfaces of the filler bodies 25a and the insulating adhesive film 15 is exposed to plasmas of an ammonia ($NH_3$) gas to reform the upper surfaces. This processing will be also hereinafter referred to as ammonia plasma processing.

Conditions for the ammonia plasma processing are not particularly limited. In the present embodiment, flow rate of the ammonia gas introduced into a processing chamber is set to 350 sccm, a pressure in the chamber is set to 1 Torr, a substrate temperature is set to 400° C., power of a high-frequency power source with a frequency of 13.56 MHz applied to the substrate is set to 100 W, power of a high-frequency power source with a frequency of 350 kHz supplied to a plasma generation region is set to 55 W, a distance between an electrode and the first insulating film 11 is set to 350 mils, and a time of plasma exposure is set to 60 seconds.

Figure 3C:
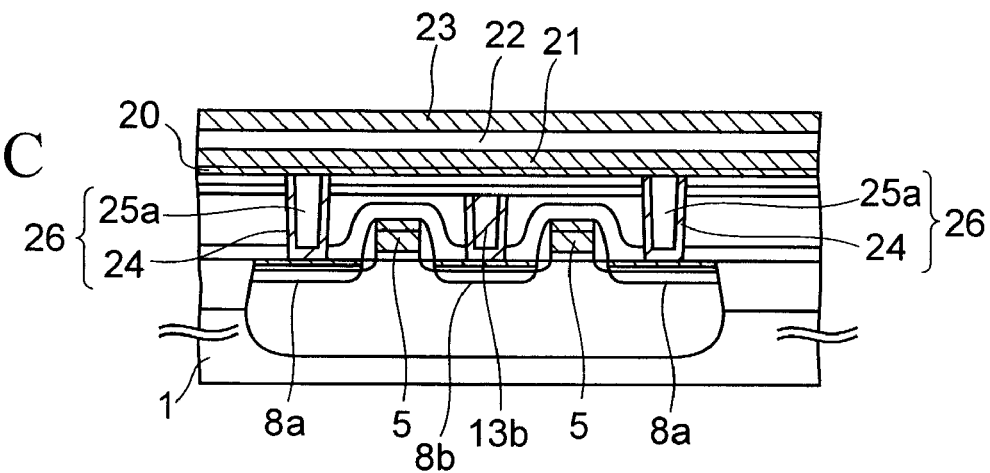

Next, processes for obtaining a cross-sectional structure shown in FIG. 3C will be described.

Firstly, a titanium aluminum nitride (TiAlN) film is formed on the upper surfaces of each of the insulating adhesive film 15 and the first contact plugs 26 by the sputtering method. The titanium aluminum nitride (TiAlN) film thus formed is used as a conductive oxygen barrier film 20. Since the conductive oxygen barrier film 20 is in contact with the conductive film 24 constituting the first contact plugs 26, the conductive oxygen barrier film 20 is electrically connected to the first source/drain regions 8a through the first contact plugs 26.

Thereafter, an iridium film as a lower electrode conductive film 21 is formed with a thickness of approximately 50 to 200 nm, more preferably 100 nm, on the conductive oxygen barrier film 20. Here, since the ammonia plasma processing has been already carried out on the upper surfaces of the filler bodies 25a as described above, a lower electrode conductive film 21 over the filler bodies 25a is easily oriented in a (111) direction. To effectively obtain such an advantage, it is preferable that the insulating material constituting the filler bodies 25a be the material in which N—H bond can be formed in its surface by the exposure to the ammonia plasma. Such an insulating material includes silicon oxide or the like. This is also the case for the embodiments to be described below.

Next, a lead zirconate titanate (PZT: $PbZrTiO_3$) film as a ferroelectric film 22 is formed with a thickness of approximately 50 to 150 nm, more preferably 100 nm, on the lower electrode conductive film 21 by a metal organic CVD (MOCVD) method. Film-forming methods of the ferroelectric film 22 include the sputtering method and the sol-gel method in addition to the MOCVD method. Furthermore, the material of the ferroelectric film 22 is not limited to the above-described PZT. The ferroelectric film 22 may be formed of a Bi layered structure compound such as $SrBi_2Ta_2O_9$ or $SrBi_2(Ta, Nb)_2O_9$. Furthermore, the ferroelectric film 22 may be PLZT which is formed by doping lanthanum into PZT, or other metal oxide ferroelectrics.

Thereafter, an iridium oxide ($IrO_2$) film is formed with a thickness of 50 to 200 nm, more preferably 100 nm, on the ferroelectric film 22 by the sputtering method. The iridium oxide film thus formed is used as an upper electrode conductive film 23.

Here, the first contact plugs 26 under the conductive barrier film 20 are made of the amorphous filler bodies 25a. Consequently, an orientation of the conductive oxidation barrier film 20 is not deteriorated like the case where the contact plug 26 is made of a crystalline material, for example tungsten. Accordingly, it becomes easy for the lower electrode conductive film 21 on the conductive film 20 to be spontaneously orientated in the (111) direction. Thus, the orientation of the ferroelectric film 22 is aligned in the (111) direction by the preferable orientation of the lower electrode conductive film 21.

Moreover, since recesses are not formed in the upper surfaces of the filler bodies 25a, the ferroelectric film 22 can be well oriented over the filler bodies.

Furthermore, by carrying out the above-described ammonia plasma processing on the filler bodies 25a, the orientation of the lower electrode conductive film 21 is aligned. By this reason, too, the ferroelectric film 22 is well oriented.

In this example, the conductive oxygen barrier film 20 is formed for preventing the first contact plugs 26 from being oxidized. However, in the present embodiment, the first contact plugs 26 are not formed of tungsten which is easily oxidized, and therefore the conductive oxygen barrier film 20 may be omitted. Even if the conductive oxygen barrier film 20 is omitted like this, the orientation of the ferroelectric film 22 can be improved as described above.

Figure 3D:
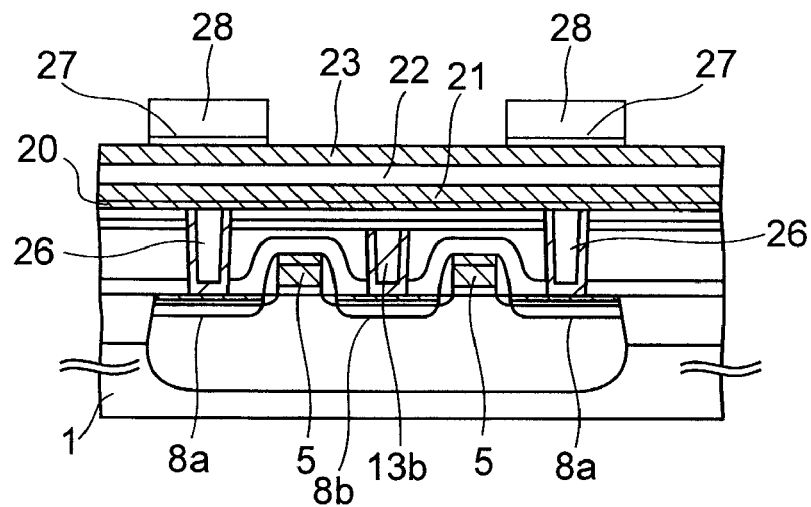

Next, as shown in FIG. 3D, a titanium nitride film as a first hard mask 27 is formed with a thickness of approximately 200 nm on the upper electrode conductive film 23 by the sputtering method. Then, a silicon oxide film is further formed on the first hard mask 27 by the CVD method as a second hard mask 28. Thereafter, these hard masks 27 and 28 are patterned into a capacitor planar shape by photolithography.

Figure 3E:
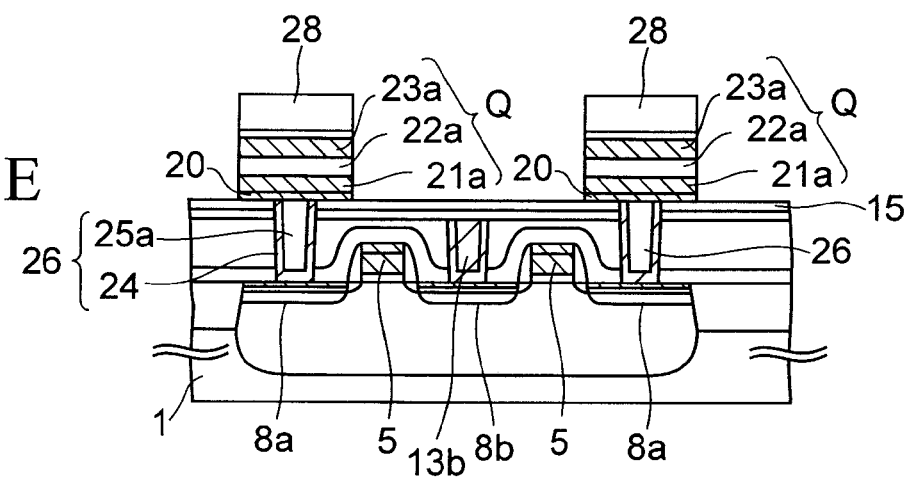

Next, as shown in FIG. 3E, the portions of the first conductive film 21, the ferroelectric film 22, and the second conductive film 23, which are not covered with the first and second hard masks 27 and 28, are dry-etched at the same time by using an etching gas including a halogen gas. Thereby, capacitors Q, each of which is constructed by sequentially laminating a lower electrode 21a which is electrically connected to the conductive film 24 of the first contact plug 26, a capacitor dielectric film 22a, and an upper electrode 23a, are formed on the insulating adhesive film 15.

The film exfoliation of the conductive oxygen barrier film 20 under the capacitors Q is prevented by the insulating adhesive film 15. When the conductive oxygen barrier film 20 is not formed, the film exfoliation of the lower electrodes 21a constituting the capacitors Q is prevented by the insulating adhesive film 15.

Thereafter, the first and second hard masks are removed by wet etching and dry etching.

Figure 3F:
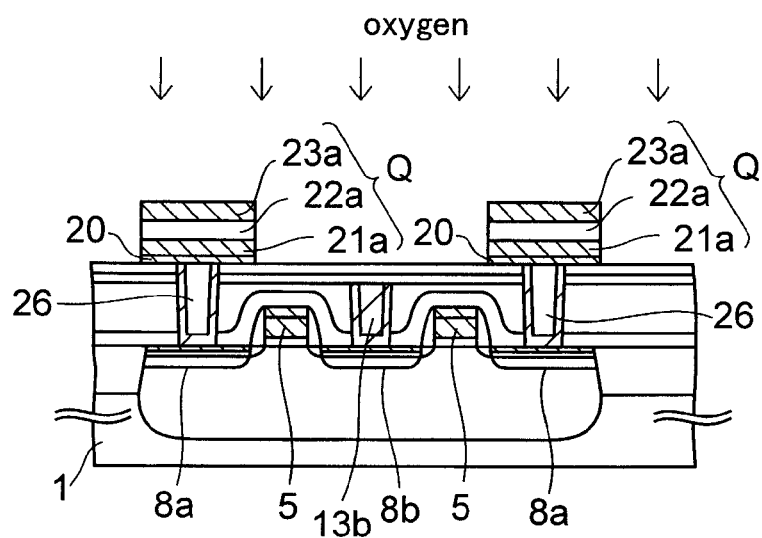

Next, as shown in FIG. 3F, in order to recover damages received in the capacitor dielectric films 22a during the above-described process of the etching in FIG. 3E and the like, the silicon substrate 1 is placed in an unillustrated furnace, and the first recovery annealing is carried out in the oxygen atmosphere at a substrate temperature of 550° C. for approximately 40 minutes.

Here, each of the first contact plugs 26 located directly under the capacitors Q is made of the filler body 25a, which is made of an insulating material, and the conductive film 24 of a titanium nitride film or the like, which hardly loses conductivity even after the annealing. Accordingly, even if the recovery annealing is carried out in the oxygen atmosphere in this manner, the first contact plugs 26 can be prevented from being oxidized, and an increase in the contact resistance between the plugs 26 and the first source/drain regions 8a can be prevented. Thereby, the contact resistance can be suppressed low as designed.

Next, processes for obtaining a cross-sectional structure shown in FIG. 3G will be described.

Firstly, in order to protect the capacitor dielectric film 22a from a reducing atmosphere such as hydrogen, an alumina film with an excellent hydrogen blocking capability is formed with a thickness of approximately 50 nm on the entire upper surface of the silicon substrate 1. The alumina film thus formed is used as a capacitor protective insulating film 40.

Film forming methods of the capacitor protective insulating film 40 is not particularly limited. However, when the capacitor protective insulating film 40 is formed by an atomic layer deposition (ALD) method that is excellent in a coverage characteristic, the capacitor protective insulating film 40 can be formed on the sides of the capacitor Q with good coverage. Accordingly, a gap between the adjacent capacitors Q can be narrowed, so that miniaturization of FeRAM can be pursued.

Thereafter, a second insulating film 41 is formed on the capacitor protective insulating film 40 by using a high density plasma CVD (HDPCVD) method using a silane as a reaction gas. The space between the two adjacent capacitors Q is completely filled by the second insulating film 41. A thickness of the second insulating film 41 is not particularly limited. In the present embodiment, it is set to be approximately 700 nm over the flat surface of the silicon substrate 1.

Thereafter, a silicon oxide film as a sacrificial insulating film 42 is formed on the second insulating film 41 by the plasma CVD method using a TEOS gas. A thickness of the sacrificial insulating film 42 is, for example, approximately 800 nm over the flat surface of the silicon substrate 1.

Figure 3G:
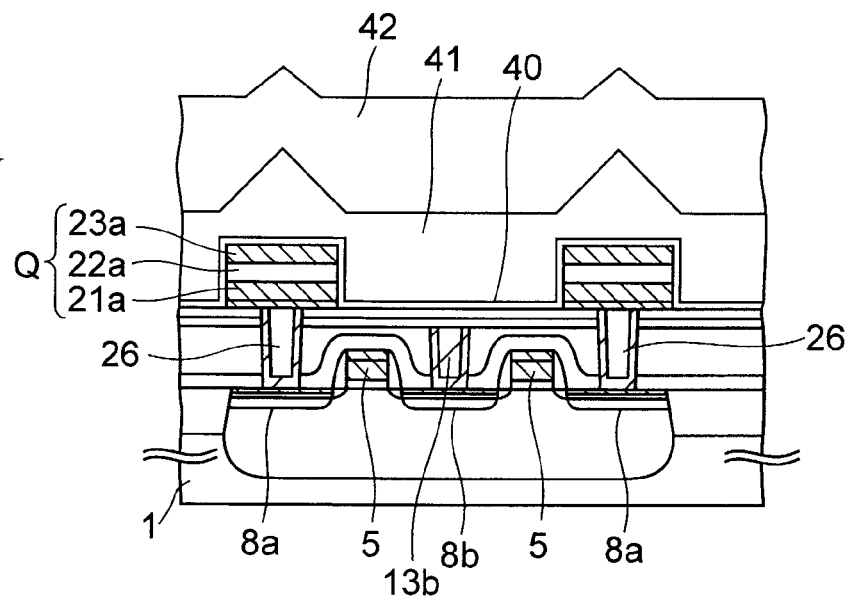
Figure 3H:
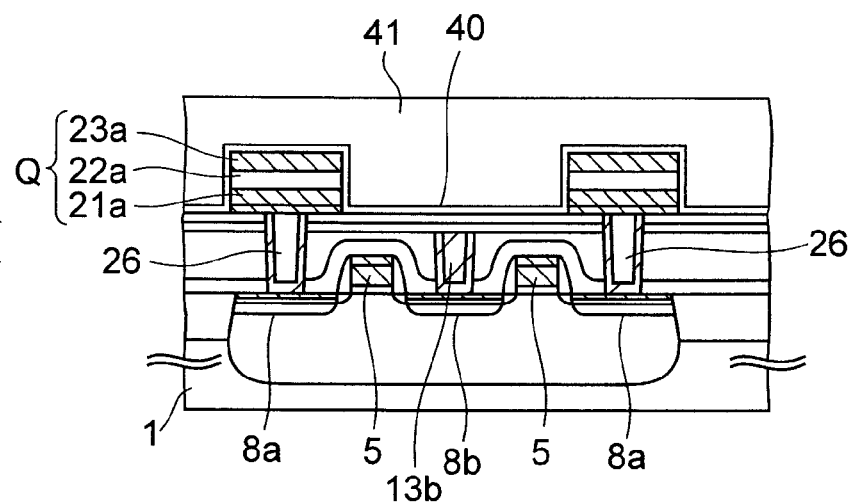

Then, as shown in FIG. 3H, the sacrificial insulating film 42 is polished by the CMP method to planarize the upper surface of the second insulating film 41. The thickness of the second insulating film 41 is made to approximately 700 nm over the flat surface of the silicon substrate 1 by this CMP.

Next, processes for obtaining a cross-sectional structure shown in FIG. 3I will be described.

Firstly, a photoresist is coated on the second insulating film 41, and is exposed and developed to form a first resist pattern 43 provided with hole-shaped first windows 43a over the upper electrode 23a.

Then, the second insulating film 41 and the capacitor protective insulating film 40 are etched through the first windows 43a to form third holes 41a with a depth reaching the upper electrode 23a in these insulating films 40 and 41. This etching is carried out in a parallel plate-type plasma etching chamber using a mixed gas of $C_4F_8$, Ar, and $O_2$ as an etching gas, and a pressure is set to be 2 to 7 Pa during the etching. In addition, high-frequency power with a frequency of 13.56 MHz and power of 1 to 2.5 kW is applied to an upper electrode of the etching chamber, so that the above etching gas is converted to plasma.

After this etching is finished, the first resist pattern 43 is removed.

Then, in order to recover damages received in the capacitor dielectric film 22a during the processes so far, the silicon substrate 1 is placed in an unillustrated furnace, and the second recovery annealing is carried out in the oxygen atmosphere at a substrate temperature of 550° C. for approximately 40 minutes.

Figure 3I:
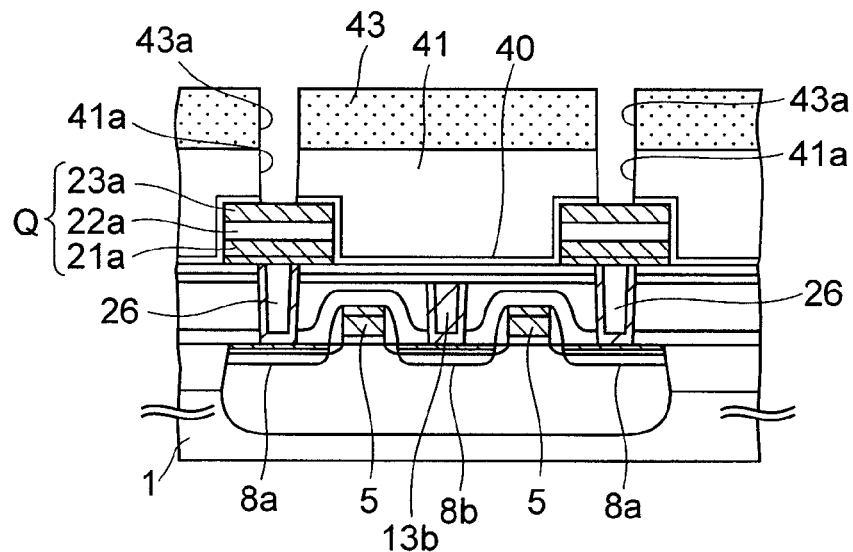
Figure 3J:
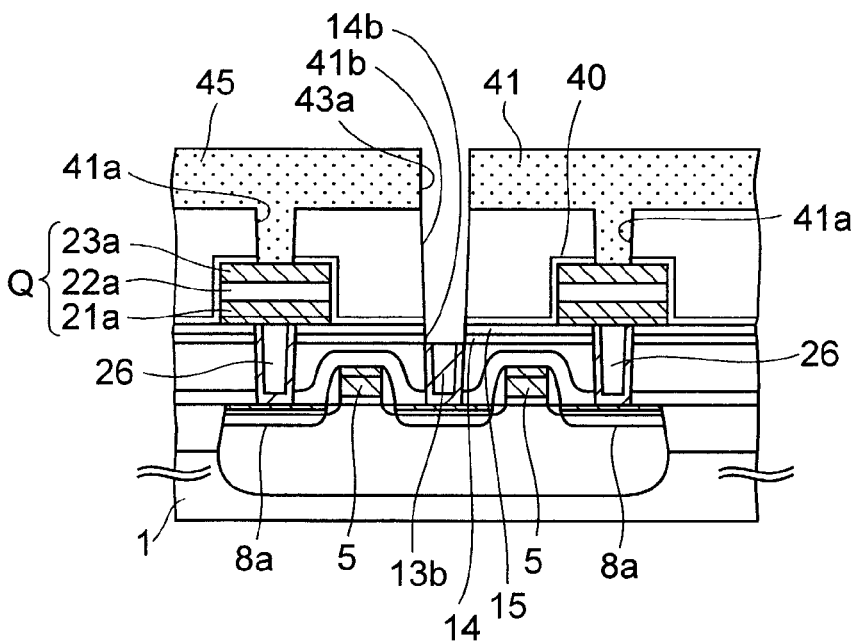

Next, as shown in FIG. 3J, a photoresist is coated on the second insulating film 41 again, and the photoresist is exposed and developed to form a second resist pattern 45. By this development, hole-shaped second windows 45a are formed in the second resist pattern 45 over the second contact plug 13b.

Thereafter, the films from the second insulating film 41 through the oxidation preventive insulating film 14 are etched through the second windows 45a, so that a forth hole 41b is formed in the second insulating film 41, and a second opening 14b is formed in the oxidation preventive insulating film 14. This etching is carried out in a parallel plate plasma etching equipment using a mixed gas of $C_4F_8$, Ar, $O_2$, and CO as an etching gas.

Figure 3K:
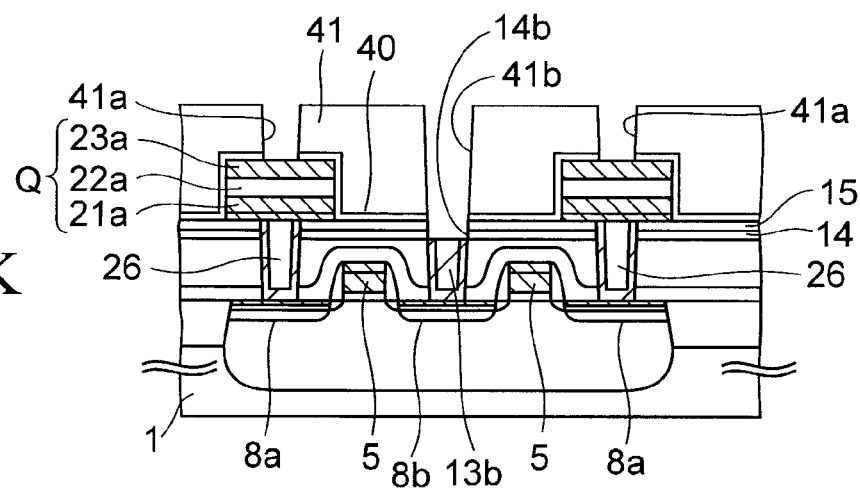

Next, as shown in FIG. 3K, the second resist pattern 45 is removed.

As described above, the deep fourth hole 41b over the second source/drain region 8b is formed in the different step than that for forming the shallow third hole 41a over the upper electrodes 23a. Consequently, the upper electrodes 23a under the third shallow holes 41a can be prevented from being exposed to the etching atmosphere for a long time, and the deterioration of the capacitor dielectric films 22a thereunder can be suppressed.

Furthermore, the second contact plug 13b on the second source/drain region 8b is covered with the oxidation preventive insulating film 14 until the present step is finished. Accordingly, the contact defect, which is caused by oxidation of tungsten constituting the second contact plug 13b, is prevented.

Next, processes for obtaining a cross-sectional structure shown in FIG. 3L will be described.

Firstly, a titanium nitride film as a barrier metal film is formed with a thickness of approximately 50 nm on the upper surface of the second insulating film 41 and each of inner surfaces of the third and fourth holes 41a and 41b by the sputtering method. Then, a tungsten film is formed on the barrier metal film with a thickness sufficient to fill the third and fourth holes 41a and 41b, for example, a thickness of 300 nm on the flat surface of the second insulating film 41.

Thereafter, the excessive barrier metal film and tungsten film on the second insulating film 41 are polished and removed by the CMP method. The barrier metal film and the tungsten film is thus left in the third and fourth holes 41a and 41b as third and fourth contact plugs 47a and 47b, respectively.

Among these contact plugs, the third contact plugs 47a are electrically connected to the upper electrodes 23a. Then, the fourth contact plug 47b is electrically connected to the second contact plug 13b, and constitutes a part of the bit line together with the second contact plug 13b.

After that, a metal laminated film is formed on the second insulating film 41 by the sputtering method. The metal laminated film is then patterned to form first layer metal wirings 49a and a bit line metal pad 49b. The metal laminated film is formed by laminating, for example, a titanium nitride film with a thickness of approximately 50 nm, an aluminum film with a thickness of approximately 360 nm, and a titanium nitride film with a thickness of approximately 70 nm in this order.

By the processes so far, the basic structure of the semiconductor device according to the present embodiment has been completed.

In this semiconductor device, the second contact plug 13b and the fourth contact plug 47b, each serving as a part of the bit line, constitute a via-to-via structure. In the case where a logic-embedded FeRAM is manufactured by forming a logic circuit on the silicon substrate 1 in addition to the capacitors Q, the electric connection between a source/drain region of a MOS transistor in the logic circuit and first metal wirings is also made by this via-to-via structure.

Figure 3L:
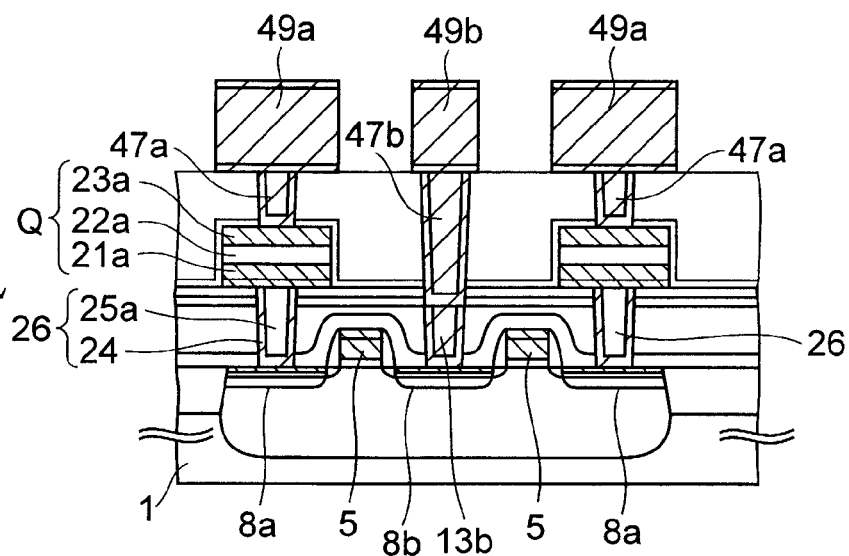

According to the above-described present embodiment, as shown in FIG. 3L, the first contact plugs 26 located directly under the capacitors Q are formed by covering the side and bottom surfaces of the amorphous filler bodies 25a with the conductive film 24. Since the filler bodies 25a are amorphous, the orientations of the conductive oxygen barrier films 20, which is in contact with the filler bodies, and lower electrodes 21a are not affected by the filler bodies 25a. Thus, the orientations of the conductive oxygen barrier films 20 and lower electrodes 21a are aligned in the (111) direction that is preferable for increasing residual polarization charges of the capacitor dielectric film 22a. As a result, the orientation of the capacitor dielectric films 22a are also aligned in the (111) direction by the effect of the lower electrodes 21a. Thus, the residual polarization charges of the capacitor dielectric films 22a are increased, so that it can be easily performed to write and read out information in the capacitor Q.

Furthermore, as described in FIG. 3B, the CMP polishing rates of the insulating adhesive film 15 and insulating material film 25 are substantially same, and thus recesses are not formed in the filler bodies 25a due to this CMP. Accordingly, the deterioration of the orientation of the capacitor dielectric film 22a due to the recesses can be suppressed, and the ferroelectric characteristics of the capacitor dielectric film 22a, such as residual polarization charges and the like, can be further enhanced. Even if the insulating material film 15 is not formed, similar to the aforementioned case, recesses can be prevented from being formed in the filler bodies 25a because the polishing rates of the oxidation preventive insulating film 14 and insulating material film 25 are substantially same.

Moreover, the filler bodies 25a are formed of an insulating material, and the conductive film covering the filler bodies 25a is formed of a titanium nitride film or the like which is hardly oxidized. Thus, even if the recovery annealing is carried out in the oxygen atmosphere in the processes of FIGS. 3F and 3J, the first contact plugs 26 directly under the capacitors Q are hardly oxidized. Accordingly, the contact resistance between the first contact plugs 26 and first source/drain regions 8a can be kept low.

Second Embodiment

Figure 4:
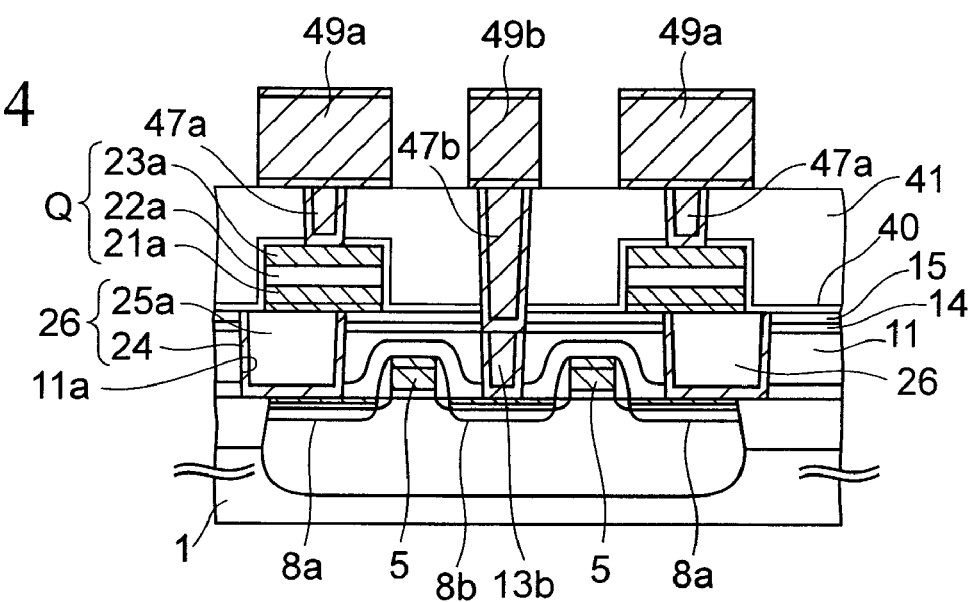
FIG. 4 is a cross-sectional view showing a process of manufacturing a semiconductor device according to a second embodiment.

FIG. 4 is a cross-sectional view of a semiconductor device according to a second embodiment. Note that same reference numerals are given to denote components same as those described in the first embodiment, and the description thereof will be omitted.

In the present embodiment, as shown in FIG. 4, diameters of first contact plugs 26 are set to be larger than that of the second contact plug 13b. The configuration other than this is the same as that of the first embodiment.

As described in FIG. 1G, when the first holes 11a are filled by the second tungsten film 18, in order to prevent the occurrence of film exfoliation due to the strong stress of tungsten, it is required that the diameters of the first holes 11a be set to be small so that the holes 11a can be filled with the thin second tungsten film 18.

In contrast, in the first embodiment, as described in FIG. 3A, the first holes 11a are filled with the insulating material film 25, and thus there is no need to be concerned about the film exfoliation caused by the stress seen in the tungsten film. Accordingly, there is no limitation to the diameters of the first holes 11a.

In order to sufficiently utilize such freedom for designing a first hole 11a, as shown in FIG. 4, a diameter of the first hole 11a is set to be larger than that of the second hole 11b in the present embodiment. As long as the conductive film 24 is electrically connected to the lower electrode 21a, the first hole 11a may protrude from the capacitor Q as shown in the figure.

According to this structure, an aspect ratio of the first hole 11a becomes smaller. Thus, high step coverage is not required for the conductive film 24 formed in the first hole 11a. Therefore, even if the conductive film 24 is formed by an inexpensive sputtering method that the step coverage is relatively bad, a void is difficult to be formed in the conductive film 24. Consequently, the contact defect to be caused in the first contact plugs 26 can be suppressed.

Third Embodiment

FIGS. 5A to 5H are cross-sectional views showing processes of manufacturing a semiconductor device according to a third embodiment. Note that in these figures, same reference numerals are given to denote components same as those described in the first and second embodiments, and the description thereof will be omitted.

Figure 5A:
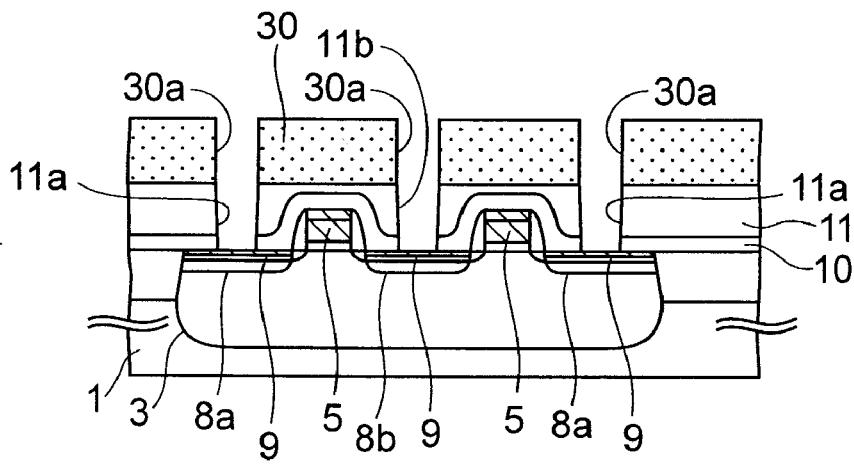
FIGS. 5A to 5H are cross-sectional views showing a process of manufacturing a semiconductor device according to a third embodiment.

Firstly, the above-described cross-sectional structure of FIG. 1A is obtained in order to manufacture this semiconductor device. Subsequently, as shown in FIG. 5A, a photoresist is coated on a first insulating film 11, and then the photoresist is exposed and developed to form a first resist pattern 30 provided with first and second windows 30a and 30b over first and second source/drain regions 8a and 8b, respectively.

Thereafter, the first insulating film 11 and the cover insulating film 10 are etched through the first and second windows 30a and 30b so as to form first and second contact holes 11a and 11b in the first insulating film 11. This etching is carried out by RIE. A mixed gas of $C_4F_8$, Ar, and $O_2$ is used as an etching gas in this etching.

The first resist pattern 30 is removed after this etching is finished.

Figure 5B:
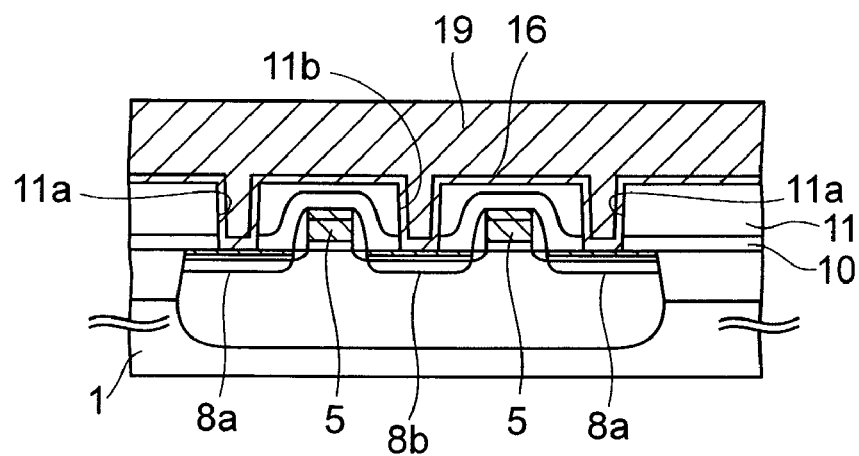

Next, as shown in FIG. 5B, a titanium nitride film is formed on each of inner surfaces of the first and second contact holes 11a and 11b and on an upper surface of the first insulating film 11 by the sputtering method as a conductive film 16. The conductive film 16 is not limited to the titanium nitride film as long as it is such a film that hardly loses conductivity even by high-temperature annealing in an oxygen atmosphere, such as recovery annealing. Such films include either a single layer film of any one of a titanium film, a titanium nitride film, a titanium aluminum nitride film, an iridium film, an iridium oxide ($IrO_2$) film, a platinum film, and a ruthenium film, or a laminated film formed by laminating at least two of these films.

Note that the titanium nitride film may be formed not by the sputtering method but by the CVD method.

Furthermore, a thickness of the conductive film 16 is set so that contact resistance with the first and second source/drain regions 8a and 8b thereunder would be a designed value. In the present embodiment, the thickness of the conductive film 16 is set to be, for example, 20 to 100 nm.

Thereafter, a tungsten film as a conductive material film 19 is formed on the conductive film 16 by the CVD method using a hexafluoride tungsten gas. The first and second holes 11a and 11b are completely filled by the conductive material film 19.

Figure 5C:
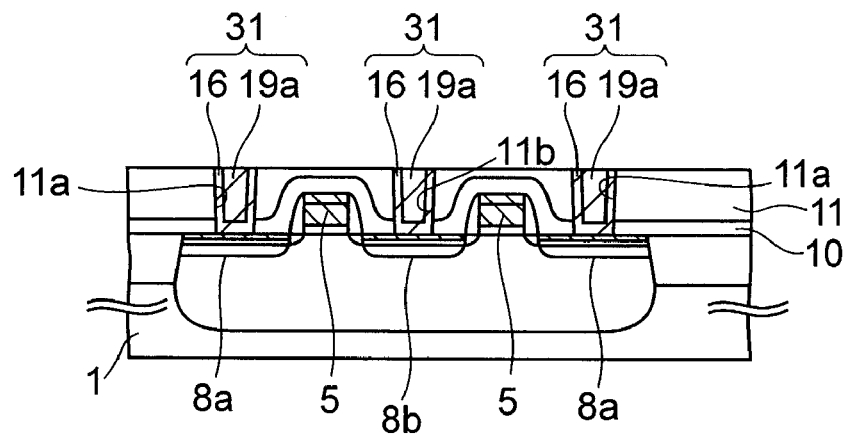

Next, as shown in FIG. 5c, the excessive conductive film 16 and conductive material film 19 formed on the first conductive film 11 are polished and removed by the CMP method to leave the conductive material film 19 as lower filler bodies 19a in the first and second holes 11a and 11b. With this, lower plugs 31 constructed from the lower filing bodies 19a and the conductive material film 16 covering side and bottom surfaces thereof are formed in the holes 11a and 11b.

Figure 5D:
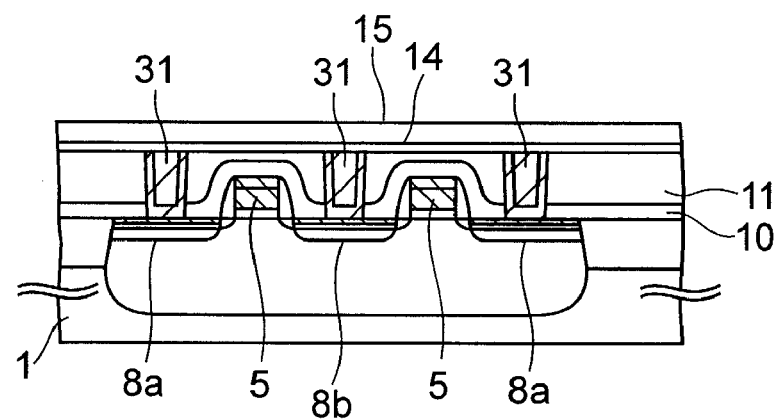

Next, as shown in FIG. 5D, a silicon oxynitride film is formed with a thickness of approximately 130 nm by the plasma CVD method as an oxidation preventive insulating film 14 for protecting the lower plugs 31 from being oxidized.

Thereafter, a silicon oxide film is formed with a thickness of approximately 200 nm on the oxidation preventive insulating film 14 by the plasma CVD method. The silicon oxide film thus formed is used as an insulating adhesive film 15. The insulating adhesive film 15 plays a role to improve adhesion strength with a lower electrode of a capacitor. However, if the adhesion strength is secured without forming the insulating adhesive film 15, the insulating adhesive film 15 may be omitted.

Figure 5E:
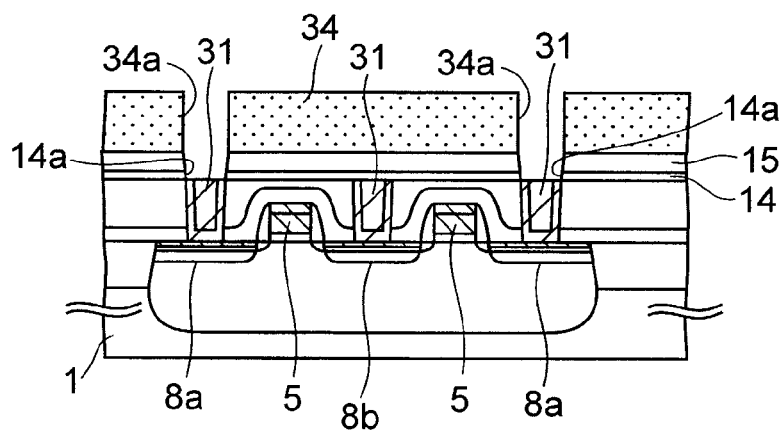

Next, processes for obtaining a cross-sectional structure shown in FIG. 5E will be described.

Firstly, a photoresist is coated on the insulating adhesive film 15, and then the photoresist is exposed and developed to form a second resist pattern 34 provided with third windows 34a over first holes 11a. Then, the insulating adhesive film 15 and the oxidation preventive insulating film 14 are etched through the third windows 34a, so that first openings 14a are formed in the oxidation preventive insulating film 14 over the first source/drain regions 8a. Note that this etching is carried out by RIE for example, and a mixed gas of $C_4F_8$, $CF_4$, Ar, and CO is used as an etching gas for each of the insulating adhesive film 15 and the oxidation preventive insulating film 14.

Thereafter, the second resist pattern 34 is removed.

Figure 5F:
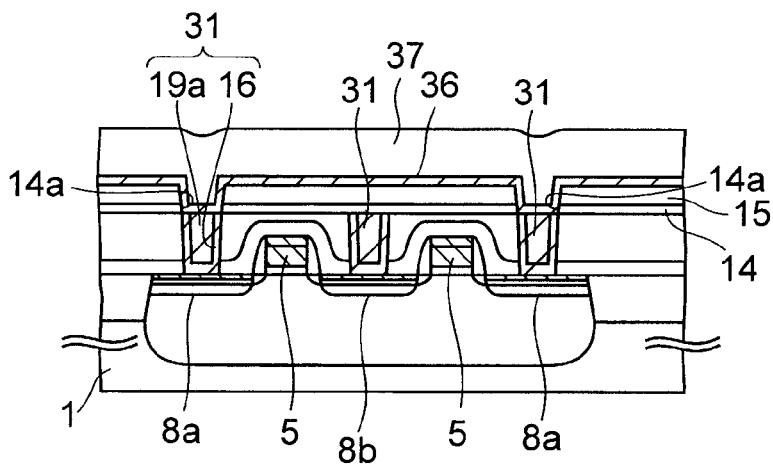

Next, as shown in FIG. 5F, a titanium film is formed as an upper conductive film 36 with a thickness of approximately 50 nm on the inner surfaces of the first openings 14a and the upper surface of the insulating adhesive film 15 by the sputtering method. It is preferable that a film with a high oxygen barrierability be used as the upper conductive film 36 in order to prevent the oxidation of the lower plugs 31, which are mainly formed of tungsten. Such films include either a single layer film of any one of a titanium film, a titanium nitride film, a titanium aluminum nitride film, an iridium film, an iridium oxide ($IrO_2$) film, a platinum film, and ruthenium film, or a laminated film formed by laminating at least two of these films.

In addition, as shown in the figure, the upper conductive film 36 is in contact with the conductive film 16 of the lower plugs 31. Thereby, the upper conductive film 36 is electrically connected to the conductive film 16.

Thereafter, a silicon oxide film is formed as an amorphous insulating material film 37 on the upper conductive film 36 by the plasma CVD method using a silane gas. The insulating material film 37 completely fills the first openings 14a. Similar to the upper conductive film 36, it is preferable that the amorphous insulating material film 37 be a film with high oxygen barrierability, which is capable of preventing the oxidation of the lower plugs 31. Such films include a silicon oxide film, a silicon nitride film, a silicon oxynitride film, and an alumina film.

Figure 5G:
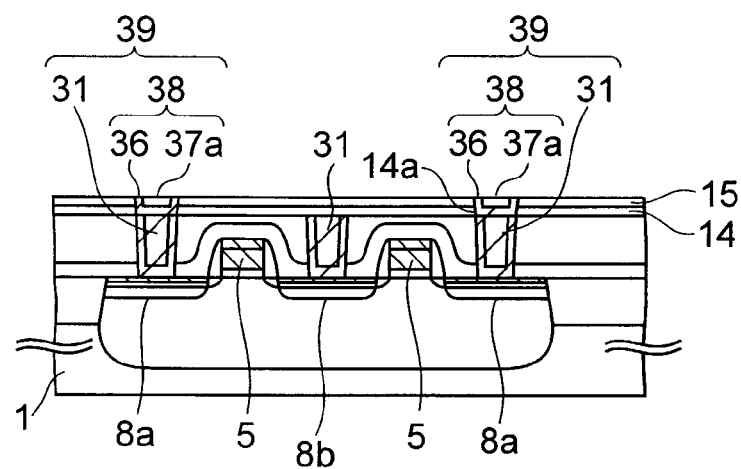

Next, as shown in FIG. 5G, the excessive upper conductive film 36 and insulating material film 37 formed on the insulating adhesive film 15 are polished and removed by the CMP method to leave the insulating material film 37 only in the first openings 14a as upper filler bodies 37a. This CMP method uses slurry for an insulating film, for example, slurry manufactured by Cabot Microelectronics Corporation. The insulating material film 37 and the insulating adhesive film 15 have substantially same polishing rates for the slurry for an insulating film. Thus, recesses are not formed in the upper surfaces of the upper filler bodies 37a even after the polishing is finished. Note that even if the insulating adhesive film 15 is not formed, for a reason same as that described above, recesses are not formed in upper surfaces of the upper filler bodies 37a because the polishing rate of the oxidation preventive insulating film 14 is substantially same as that of the insulating material film 37.

With this, upper plugs 38, each of which is constructed from the upper filler body 37a and the upper conductive film 36 covering the side and bottom surfaces thereof are formed in the first openings 14a. Furthermore, the upper plugs 38 are electrically connected to the lower plugs 31 thereunder, and constitute first contact plugs 39 together with the lower plugs 31.

Note that ammonia plasma processing may be carried out on the upper filler bodies 37a under conditions described in the first embodiment after forming the upper plugs 38 as described above, so that lower electrodes 21a to be formed in the next process would be easily orientated in a (111) direction.

Figure 5H:
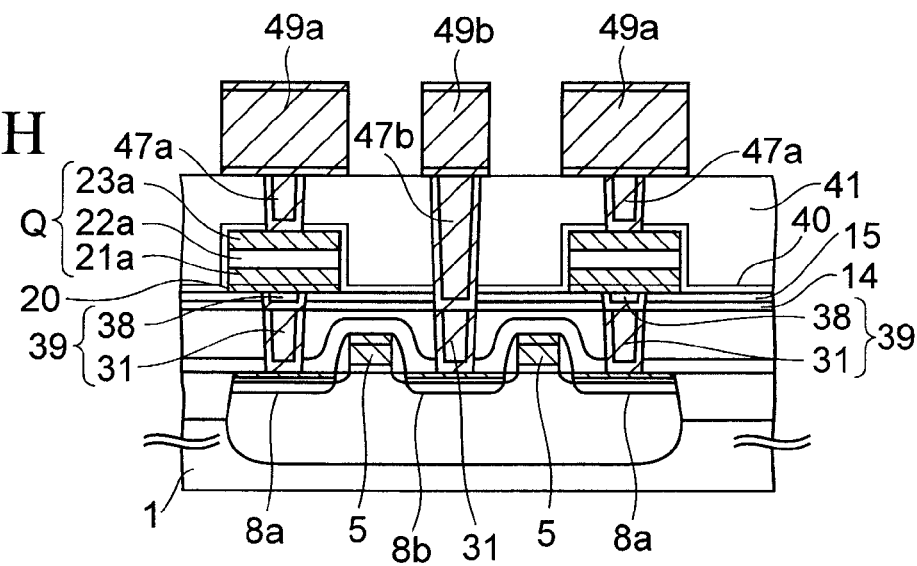

Thereafter, by carrying out the processes of FIGS. 3C to 3L described in the first embodiment, as shown in FIG. 5H, capacitors Q that are electrically connected to the first contact plugs 39 are formed. As shown in the figure, a fourth contact plug 47b constituting the bit line forms a via-to-via structure together with the lower plug 31 thereunder. Similar to the first embodiment, if a logic-embedded FeRAM is manufactured, the electric connection between a source/drain region of a MOS transistor in the logic circuit and a first metal wiring is also made with the via-to-via structure.

With this, the basic structure of the semiconductor device according to the present embodiment has been completed.

According to this semiconductor device, as shown in FIG. 5H, each of the first contact plugs 39 directly under the capacitors Q is constructed from the lower plug 31 and the upper plug 38. Of these plugs, the upper plugs 38 are formed in the oxidation preventive insulating film 14 formed over the gate electrodes 5. Accordingly, even if the upper plugs 38 are laterally displaced, the upper plugs 38 are prevented from coming in contact with or coming extremely close to the gate electrodes 5, so that a design margin and process margin of the upper plugs 38 can be widened.

Furthermore, since the upper filler bodies 37a constituting the upper plugs 38 are amorphous, orientations of the lower electrodes 21a are not deteriorated by the upper-level plugs 38. Consequently, capacitor dielectric films 22a can be well oriented by the orientations of the lower electrodes 21a. As a result, the dielectric characteristics of the capacitor dielectric films 22a can be increased.

Moreover, as described by referring to FIG. 5G, in the process of forming the upper filler bodies 37a in the first openings 14a by the CMP polishing, the polishing rates of the insulating material film 37 and the insulating adhesive film 15 are substantially same. Thus, recesses are not formed in the upper surfaces of the upper filler bodies 37a. Accordingly, the lower electrodes 21a of the capacitors Q can be formed on a flat surface where unevenness is almost absent, so that the orientations of the capacitor dielectric films 22a can be prevented from being deteriorated due to the unevenness of the underlying layer.

Fourth Embodiment

FIGS. 6A to 6G are cross-sectional views showing processes of manufacturing a semiconductor device according to a fourth embodiment. Note that in these figures, same reference numerals are given to denote components same as those described in the first to third embodiments, and the description thereof will be omitted below.

Figure 6A:
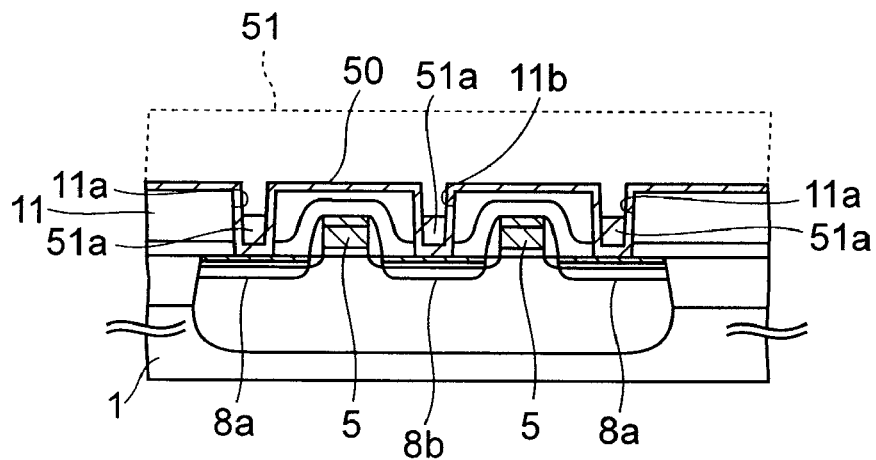
FIGS. 6A to 6G are cross-sectional views showing a process of manufacturing a semiconductor device according to a fourth embodiment.

In order to manufacture a semiconductor device according to the present embodiment, firstly, as described in FIG. 5A of the third embodiment, first and second contact holes 11a and 11b are formed in a first insulating film 11. Then, as shown in FIG. 6A, after removing a first resist pattern 30, a conductive film 50 is formed by the sputtering method on inner surfaces of the first and second contact holes 11a and 11b and an upper surface of the first insulating film 11. The material of this conductive film 50 is not particularly limited. In the present embodiment, either a single layer film of any one of a titanium film, a titanium nitride film, a titanium aluminum nitride film, an iridium film, an iridium oxide film, a platinum film, and a ruthenium film, or a laminated film formed by laminating at least two of these films, is used as the conductive film 50.

In addition, a thickness of the conductive film 50 is set so that contact resistance with first source/drain regions 8a would be a designed value. In the present embodiment, the thickness is set to be approximately, for example, 20 to 70 nm.

After that, a tungsten film is formed on the conductive film 50 as a conductive material film 51 by the CVD method. The first and second contact holes 11a and 11b are completely filled by the conductive material film 51.

Subsequently, a silicon substrate 1 is placed in an unillustrated parallel plate-type plasma etching chamber. A substrate temperature is stabilized at approximately 30° C., and thereafter $SF_6$ with a flow rate of 400 ml per minute and oxygen with a flow rate of 200 ml per minute are supplied to the etching equipment as etching gases. Then, high-frequency power of 300 W is applied to an upper electrode in the chamber, and the conductive material film 51 is selectively etched back under a condition with pressure of 60 Pa.

With this, the thickness of the conductive material film 51 can be reduced while the conductive film 50 is left on the upper surface of the first insulating film 11. Accordingly, lower filler bodies 51a made of this conductive material film 51 are formed in an intermediate depth of the first and second contact holes 11a and 11b.

In addition, an etching amount of the above-described etch-back is not particularly limited. In the present embodiment, the etching amount is set so that the upper surfaces of the lower filler bodies 51a would be lower than the upper surface of the first insulating film 11 by approximately 50 to 100 nm.

Figure 6B:
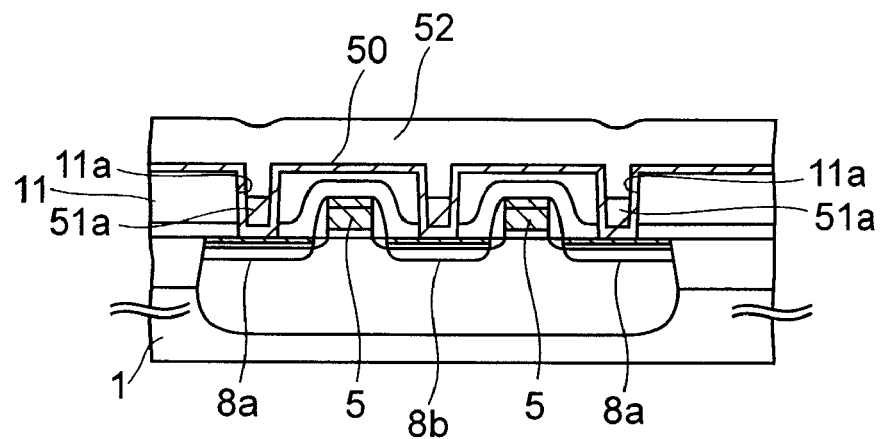

Next, as shown in FIG. 6B, a silicon oxynitride film as an amorphous insulating material film 52 is formed on each of the lower filler bodies 51a and the conductive film 50 by the plasma CVD method. The first and second contact holes 11a and 11b are completely filled by the insulating material film 52.

It is preferable that the insulating material film 52 be formed of an amorphous insulating film, which is excellent in oxygen barrierability, in order to prevent oxidation of the lower filler bodies 51a. The films having such a characteristic include a silicon nitride film and an alumina film in addition to the silicon oxynitride film. The insulating material film 52 may be formed of a signal layer film of any one of these films, or a laminated film formed by laminating at least two of these films.

Figure 6C:
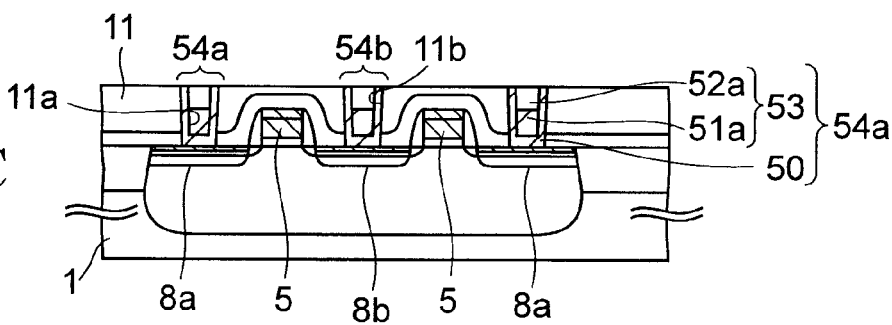

Next, as shown in FIG. 6C, the insulating material film 52 and the conductive film 50 are polished by the CMP method. Thus, the excessive insulating material film 52 and conductive film 50 on the first insulating film 11 are removed to leave the insulating material film 52 in the first and second contact holes 11a and 11b as upper filler bodies 52a.

Slurry used in this CMP is not particularly limited as long as it is to be used for an insulating film. In the present embodiment, slurry manufactured by Cabot Microelectronics Corporation is used.

Since the first insulating film 11 and the insulating material film 52 have substantially same polishing rates for such slurry for an insulating film, recesses are not formed in the upper surfaces of the upper filler bodies 52a after the CMP is finished.

In addition, the upper filler body 52a constitutes a filler body 53 together with the lower filler body 51a thereunder. With this, first and second contact plugs 54a and 54b, each of which is formed by covering the side and bottom surfaces of the filler body 53 with the conductive film 50, are formed in the first and second contact holes 11a and 11b so as to be electrically connected to first and second source/drain regions 8a and 8b, respectively.

Furthermore, in the above-described step of FIG. 6A, the conductive material film 51 is etched back so that the upper surfaces of the lower filler bodies 51a would be lowered from the upper surface of the first insulating film 11 by approximately 50 to 100 nm. Accordingly, the thickness of the upper filler bodies 52a becomes approximately 50 to 100 nm, which is sufficient to prevent the oxidation of the lower filler bodies 51a. Therefore, the lower filler bodies 51a can be prevented from causing contact defect due to oxidation thereof even if recovery annealing or the like is carried out in an oxygen atmosphere.

Note that, after the upper filler bodies 52a are formed, ammonia plasma processing may be carried out on the upper filler bodies 52a under the conditions described in the first embodiment so that lower electrodes 21a to be formed later on the upper filing bodies 52a would be easily oriented in a (111) direction.

Figure 6D:
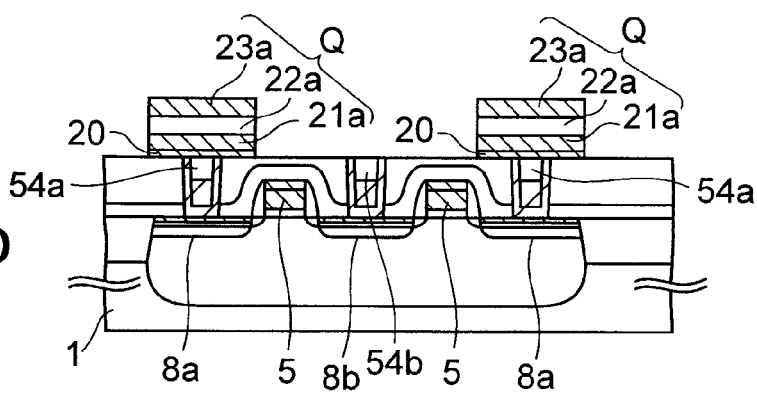

Thereafter, by carrying out the above-described processes of FIGS. 3C to 3F, as shown in FIG. 6D, capacitors Q that is electrically connected to the first contact plugs 54a are formed.

Note that in the present embodiment, as shown in FIG. 6D, a conductive oxygen barrier film 20 made of a titanium aluminum nitride or the like is formed between the lower electrode 21a and the first contact plug 54a in order to prevent oxidation of the lower filler bodies 51a made of tungsten. However, the conductive oxygen barrier film 20 is optional. The oxygen barrier film 20 may be omitted, if the oxidation of the lower filler bodies 51a can be prevented only by the upper filler bodies 52a with oxygen barrierability.

Figure 6E:
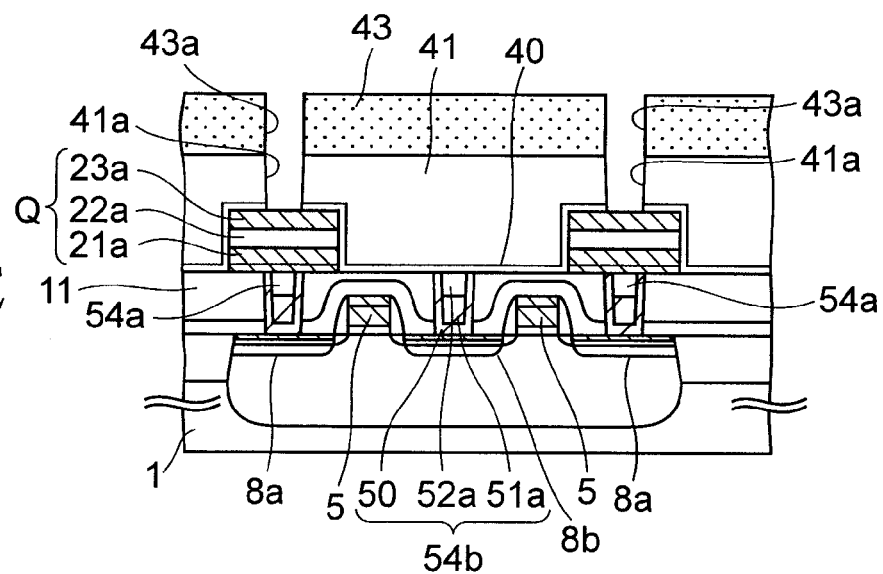

Next, the above-described processes of FIGS. 3G to 3I are carried out. With this, as shown in FIG. 6E, third holes 41a are formed in the second insulating film 41 over the capacitors Q by etching using the first resist pattern 43 as a mask.

Then, after removing the first resist pattern 43, in order to recover damages received in the capacitor dielectric films 22a during the processes so far, the silicon substrate 1 is placed in an unillustrated furnace, and recovery annealing is carried out in the oxygen atmosphere at a substrate temperature of 550° C. for approximately 40 minutes.

Figure 6F:
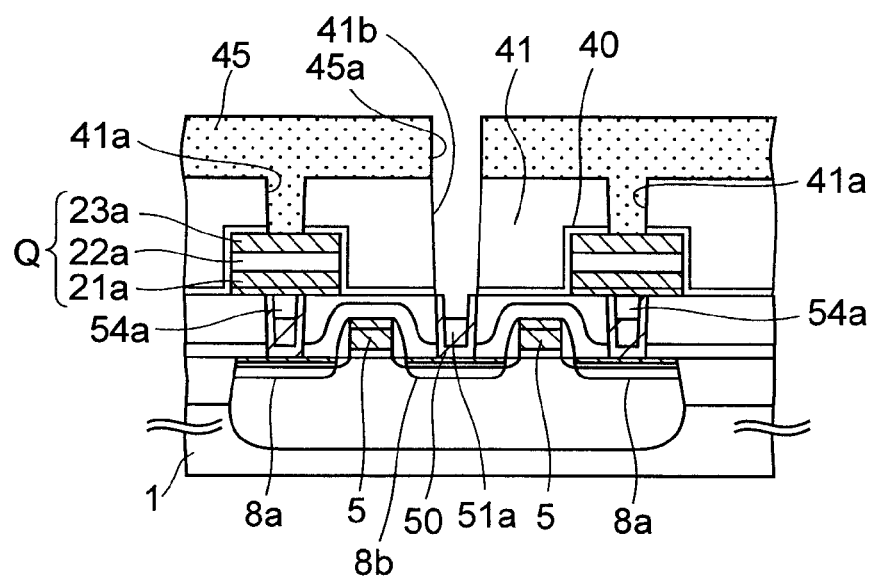

Next, processes for obtaining a cross-sectional structure shown in FIG. 6F will be described. Firstly, a photoresist is coated on the second insulating film 41, and is subjected to exposure and development to form a second resist pattern 45 provided with second windows 45a over the second contact plug 54b.

Subsequently, a mixed gas of $C_4F_8$, Ar, $O_2$, and CO is supplied to a parallel plate-type plasma etching chamber as an etching gas for example, so that the second insulating film 41 and the capacitor protective insulating film 40 are etched through the second window 45a to form a fourth hole 41b in the second insulating film 41.

Here, the etching gas also has an effect to etch the upper filler body 52a (see FIG. 6E) made of silicon oxynitride under the fourth hole 41b. Therefore, during this etching, the upper filler body 52a under the fourth hole 41b is etched, and the upper surface of the lower filler body 51a thereunder is exposed.

Thereafter, the second resist pattern 45 is removed.

Figure 6G:
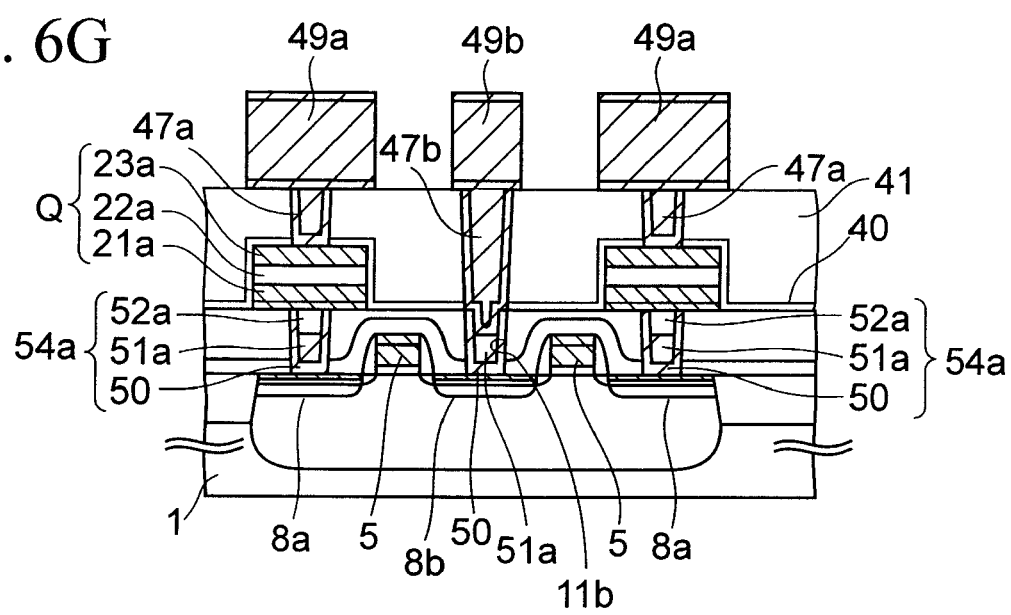

Next, by carrying out the process of FIG. 3L described in the first embodiment, as shown in FIG. 6G, third and fourth contact plugs 47a and 47b are respectively formed in the third and fourth holes 41a and 41b. Of these contact plugs, the fourth contact plug 47b is directly connected to the lower filler body 51a in the second hole 11b and is electrically connected to the second source/drain region 8b through the lower filler body 51a.

In addition, the fourth contact plug 47b and the lower filler body 51a each constituting a part of the bit line form a via-to-via structure. If a logic-embedded FeRAM is manufactured, a source/drain region in a logic circuit and a first layer metal wiring are electrically connected with this via-to-via structure.

With this, the basic structure of the semiconductor device according to the present embodiment has been completed.

According to this semiconductor device, as described in FIG. 6C, the lower filler body 51a made of tungsten, which is easily oxidized, is covered with the upper filler body 52a in the second contact plug 54b for the bit line, so that the lower filler body 51a can be protected by the upper filler body 52a from being oxidized. Accordingly, unlike the first embodiment, it is not necessary to form the oxidation preventive insulating film 15 for the purpose of preventing the oxidation of the second contact plug 13b (see FIG. 3B), so that the manufacturing processes are simplified.

Furthermore, as described in FIGS. 6A to 6D, the oxidation preventive insulating film 15 is not formed as described above, so that the first contact plugs 54a directly under the capacitors Q and the second contact plug 54b for the bit line can be formed in the same process. Thus, in the present embodiment, the processes of manufacturing a FeRAM can be simplified when compared with the first to third embodiments in which these contact plugs are separately formed.

In addition, in the present embodiment, as shown in FIG. 6G, the upper surfaces of the first contact plugs 54a directly under the capacitors Q are formed of the upper filler bodies 52a made of an amorphous insulating film. Thereby, the orientations of the lower electrodes 21a are suppressed from being deteriorated by the crystallinity of the first contact plugs 54a, and the orientations of the lower electrodes 21a can be increased. As a result, the orientation of the capacitor dielectric films 22a can be also increased by the effect of the orientations of the lower electrodes 21a, so that a capacitor dielectric film 22a with excellent ferroelectric characteristics can be formed, and a FeRAM with a capacitor of high quality can be provided.

Furthermore, as described in FIG. 6C, in the step of polishing the insulating material film 52 by the CMP method to form the upper filler bodies 52a, the polishing rates of the insulating material film 52 and the first insulating film 11 are substantially same. Thus, recesses are not formed in the upper filler bodies 52a after the polishing. As a result, the flatness of the upper surfaces of the first contact plugs 54a and first insulating film 11 is increased. Therefore, the orientations of the lower electrodes 21a and the capacitor dielectric films 22a formed thereon are increased, and hence the quality of the capacitors Q can be further improved.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device comprising:
    a semiconductor substrate;
    a first impurity diffusion region formed in a surface layer of the semiconductor substrate;
    a first insulating film provided with a first hole over the first impurity diffusion region;
    a conductive film, which is formed over an inner surface of the first hole and is electrically connected to the first impurity diffusion region;
    a filler body, which is formed over the conductive film and formed in the first hole with a thickness to fill the first hole, where the filler body constituting a first contact plug together with the conductive film, and at least an upper surface of the filler body being made of amorphous insulating material, and the filler body being removed outside the first hole; and
    a capacitor, which is formed over the first contact plug and is provided with a lower electrode electrically connected to the conductive film, a capacitor dielectric film formed of a ferroelectric material, and an upper electrode.

2. The semiconductor device according to claim 1, wherein the upper surface of the filler body is planarized.

3. The semiconductor device according to claim 1, wherein all portions of the filler body is made of the insulating material.

4. The semiconductor device according to claim 1, further comprising an oxidation preventive insulating film formed over the first insulating film and having a first opening over the first hole, wherein the first contact plug is constructed from a lower plug formed in the first hole and an upper plug formed in the first opening.

5. The semiconductor device according to claim 1, wherein the filler body has a lower filler body made of a conductive material filling an intermediate depth of the first hole, and an upper filler body which is formed over the lower filler body and is made of the insulating material.

6. The semiconductor device according to claim 1, wherein the conductive film is either a single layer film of any one of a titanium film, a titanium nitride film, a titanium aluminum nitride film, an iridium film, an iridium oxide film, a platinum film, and a ruthenium film or a laminated film formed by laminating at least two of these films.

7. The semiconductor device according to claim 1, wherein the amorphous insulating material is any one of silicon oxide, silicon nitride, silicon oxynitride, and alumina.

8. The semiconductor device according to claim 3, wherein, a second hole is formed in the first insulating film at a distance from the first hole, and the semiconductor device further comprising:
   a second impurity diffusion region formed in a surface layer of the semiconductor substrate under the second hole;
   a second contact plug, which is formed in the second hole and has a height of an upper surface lower than the first contact plug and is electrically connected to the second impurity diffusion region;
   an oxidation preventive insulating film, which is formed over the first insulating film, where the oxidation preventive insulating film having a first opening over the first hole in which the first contact plug is formed, and having a second opening over the second hole;
   a second insulating film, which covers the capacitor and has third hole over the upper electrode and fourth hole over the second opening;
   a third contact plug, which is formed in the third hole and is electrically connected to the upper electrode; and
   a fourth contact plug, which is formed in the fourth hole and the second opening and is electrically connected to the second contact plug.

9. The semiconductor device according to claim 4, wherein the lower plug has the conductive film and a lower filler body made of a conductive material; and
   the upper plug has an upper filler body made of the insulating material, and an upper conductive film, which covers side and bottom surfaces of the upper filler body and is electrically connected to the conductive film.

10. The semiconductor device according to claim 8, wherein a diameter of the first contact plug is larger than a diameter of the second contact plug.

11. A method for manufacturing a semiconductor device, comprising:
    forming a first impurity diffusion region in a surface layer of a semiconductor substrate;
    forming a first insulating film over the semiconductor substrate;
    forming a first hole in the first insulating film over the first impurity diffusion region by patterning the first insulating film;
    forming a conductive film on an inner surface of the first hole;
    forming a filler body over the conductive film and in the first hole, and making the filler body and the conductive film into a first contact plug, where at least upper surface of the filler body being made of amorphous insulating material, and the filer body having a thickness to fill the first hole, and the filler body being removed outside the first hole; and
    forming a capacitor by sequentially laminating, over the first contact plug, a lower electrode electrically connected to the conductive film, a capacitor dielectric film made of a ferroelectric material, and an upper electrode.

12. The method for manufacturing a semiconductor device according to claim 11, further comprising:
    forming a second impurity diffusion region in the surface layer of the semiconductor substrate at a distance from the first impurity diffusion region;
    forming a second hole in the first insulating film over the second impurity diffusion region by patterning the first insulating film;
    forming a second contact plug, which is electrically connected to the second impurity diffusion region, in the second hole; and
    forming an oxidation preventive insulating film over each of the first insulating film and the second contact plug before forming the first hole,
    wherein, when forming the first hole, a first opening is formed in the oxidation preventive insulating film over the first hole.

13. The method for manufacturing a semiconductor device according to claim 12, further comprising:
    forming a second insulating film covering the capacitor;
    forming a third hole in the second insulating film over the upper electrode;
    forming a fourth hole in the second insulating film over the second hole, and forming a second opening in the oxidation preventive insulating film under the fourth hole;
    forming a third contact plug, which is electrically connected to the upper electrode, in the third hole; and
    forming a fourth contact plug, which is electrically connected to the second contact plug, in the fourth hole and the second opening.

14. The method for manufacturing a semiconductor device according to claim 11, wherein
    the conductive film is either a single layer film made of any one of a titanium film, a titanium nitride film, a titanium aluminum nitride film, an iridium film, an iridium oxide film, a platinum film, and ruthenium film, or a laminated film formed by laminating at least two of these films, and
    any one of silicon oxide, silicon nitride, silicon oxynitride, and alumina is used as the amorphous insulating material.

15. The method for manufacturing a semiconductor device according to claim 12, wherein, when forming the conductive film, the conductive film is also formed over the oxidation preventive insulating film, and
    the first contact plug is formed by:
    forming an amorphous insulating material film over the conductive film, and filling the first opening and the first hole by the insulating material film; and
    polishing and removing the conductive film and insulating material film over the oxidation preventive insulating film, and making the insulating material film left in the first opening and the first hole into the filler body.

16. The method for manufacturing a semiconductor device according to claim 12, wherein the first contact plug is formed by:
    forming a lower plug in the first hole; and
    forming an upper plug in the first opening, the upper plug being electrically connected to the lower-level plug and constituting the first contact plug together with the lower plug.

17. The method for manufacturing a semiconductor device according to claim 16, wherein
the lower plug is formed by:
forming a conductive material film over the conductive film; and
polishing the conductive material film to leave the conductive material film only in the first hole as a lower filler body, and making the lower filler body and the conductive film into the lower plug, and
the upper plug is formed by:
forming an upper conductive film over an inner surface of the first opening and over an upper surface of the oxidation preventive insulating film;
forming an amorphous insulating material film, which has a thickness to fill the first opening, over the upper conductive film; and
polishing the upper conductive film and the insulating material film to remove them from an upper surface of the oxidation preventive insulating film and to leave the insulating material film in the first opening as an upper filler body, and making the upper filler body and the upper conductive film into the upper plug.

18. The method for manufacturing a semiconductor device according to claim 16, wherein the lower plug is formed at the same time when the second contact plug is formed.

19. A method for manufacturing a semiconductor device, comprising:
forming a first impurity diffusion region in a surface layer of a semiconductor substrate;
forming a first insulating film over the semiconductor substrate;
forming a first hole in the first insulating film over the first impurity diffusion region by patterning the first insulating film;
forming a conductive film over an upper surface of the first insulating film and an inner surface of the first hole;
forming a conductive material film, which has a thickness to fill the first hole, over the conductive film;
forming a lower filler body made of the conductive material film in an intermediate depth of the first hole by reducing a thickness of the conductive material film;
forming an amorphous insulating material film over the lower filler body and the conductive film;
polishing each of the conductive film and the insulating material film to remove them from the upper surface of the first insulating film and to leave the insulating material film in the first hole as an upper filler body, and making the upper filler body, the lower filler body, and the conductive film into a first contact plug; and
forming a capacitor by sequentially laminating, over the first contact plug, a lower electrode electrically connected to the conductive film, a capacitor dielectric film made of a ferroelectric material, and an upper electrode.

20. The method for manufacturing a semiconductor device according to claim 19, further comprising:
forming a second impurity diffusion region in the surface layer of the semiconductor substrate at a distance from the first impurity diffusion region,
wherein, when forming the first hole, a second hole is formed in the first insulating film over the second impurity diffusion region, and
a second contact plug with a structure same as that of the first contact plug is formed in the second hole by carrying out the same method of forming the first contact plug.

* * * * *